(12) United States Patent
Kawai et al.

(10) Patent No.: US 9,933,568 B2
(45) Date of Patent: Apr. 3, 2018

(54) SEMICONDUCTOR DEVICE AND MANUFACTURING METHOD THEREOF

(71) Applicant: Renesas Electronics Corporation, Koutou-ku, Tokyo (JP)

(72) Inventors: Tohru Kawai, Ibaraki (JP); Yasutaka Nakashiba, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/363,663

(22) Filed: Nov. 29, 2016

(65) Prior Publication Data

US 2017/0153390 A1 Jun. 1, 2017

(30) Foreign Application Priority Data

Nov. 30, 2015 (JP) ................................. 2015-233031

(51) Int. Cl.
| | |
|---|---|
| *G02B 6/122* | (2006.01) |
| *H01L 21/265* | (2006.01) |
| *H01L 21/768* | (2006.01) |
| *H01L 23/522* | (2006.01) |
| *H01L 23/528* | (2006.01) |
| *H01L 29/36* | (2006.01) |
| *G02B 6/12* | (2006.01) |

(52) U.S. Cl.
CPC ......... *G02B 6/122* (2013.01); *G02B 6/12004* (2013.01); *H01L 21/26506* (2013.01); *H01L 21/76898* (2013.01); *H01L 23/528* (2013.01); *H01L 23/5226* (2013.01); *H01L 29/36* (2013.01); *G02B 2006/12061* (2013.01); *G02B 2006/12123* (2013.01); *G02B 2006/12142* (2013.01); *G02B 2006/12176* (2013.01)

(58) Field of Classification Search
CPC ......... H01L 21/02576; H01L 21/76898; H01L 23/5226; H01L 23/528; H01L 29/36; H01L 21/02579; H01L 21/26506; G02B 2006/12061; G02B 6/122; G02B 2006/12176; G02B 6/12004; G02B 2006/12123; G02B 2006/12142
See application file for complete search history.

(56) References Cited

U.S. PATENT DOCUMENTS

| | | | |
|---|---|---|---|
| 9,372,306 B1* | 6/2016 | Nagarajan | ............... B82Y 20/00 |
| 2014/0370710 A1* | 12/2014 | Kitamura | .......... H01L 27/14623 |
| | | | 438/701 |
| 2017/0062647 A1* | 3/2017 | Ellis-Monaghan | . H01L 31/1808 |

FOREIGN PATENT DOCUMENTS

JP 2012-027198 A 2/2012

* cited by examiner

*Primary Examiner* — Jasmine Clark
(74) *Attorney, Agent, or Firm* — Sughrue Mion, PLLC

(57) ABSTRACT

Provided is an SOI substrate which has a substrate, an insulating layer formed over the substrate, and a semiconductor layer formed over the insulating layer. Optical waveguides are formed in the semiconductor layer of the SOI substrate. This substrate has a low resistance semiconductor layer and a high resistance semiconductor layer thereover. Further, wirings which are formed through insulating films are provided on the optical waveguides. In this manner, the low resistance semiconductor layer is arranged in the surface part of the substrate of the insulating films, thereby restraining an eddy current generated in the substrate due to an electric signal transmitted through the wirings.

20 Claims, 27 Drawing Sheets

FIG. 2
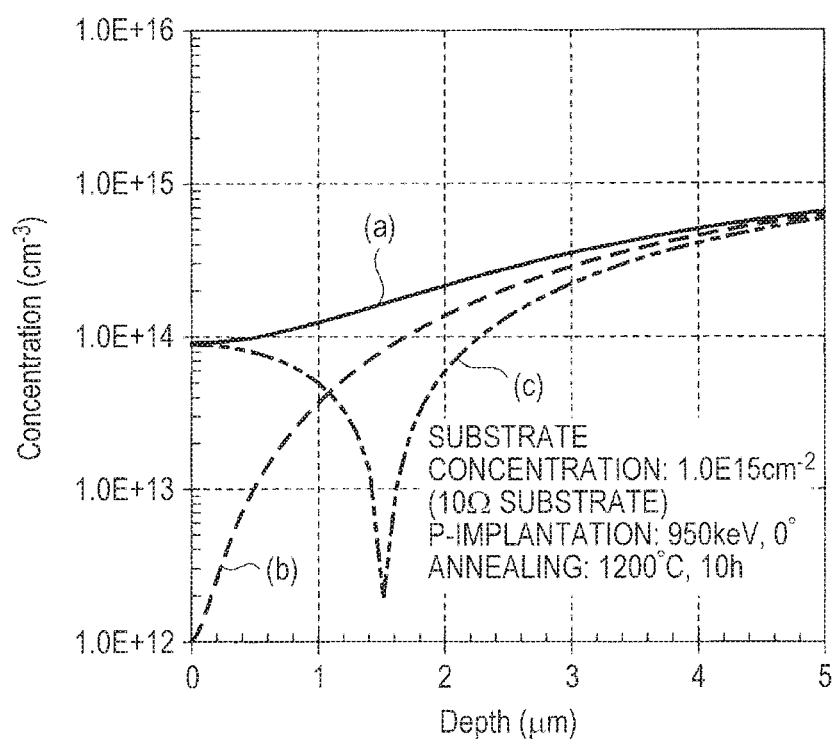
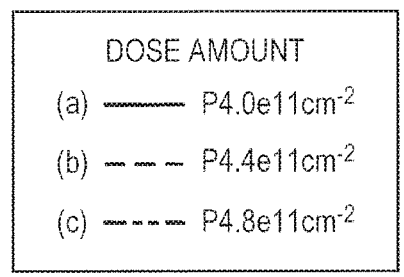

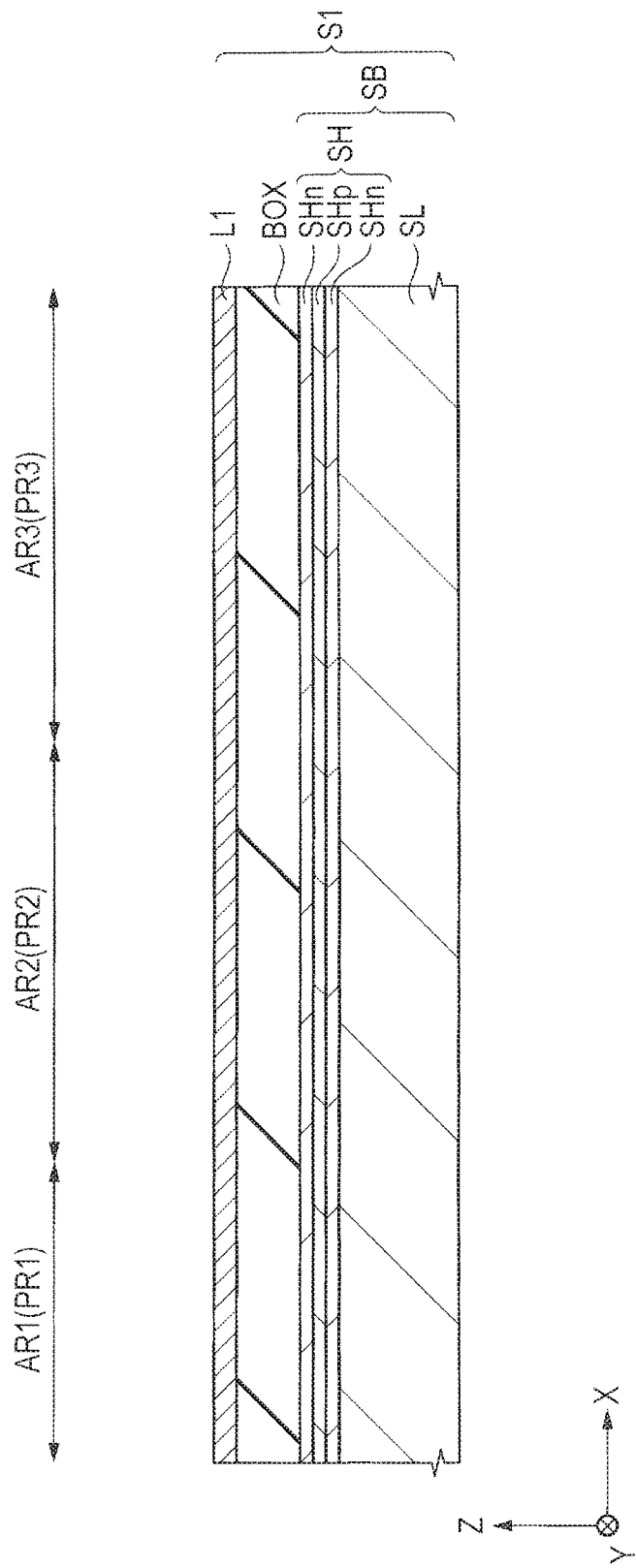

SEMICONDUCTOR DEVICE AND MANUFACTURING METHOD THEREOF

CROSS-REFERENCE TO RELATED APPLICATIONS

The disclosure of Japanese Patent Application No. 2015-233031 filed on Nov. 30, 2015 including the specification, drawings and abstract is incorporated herein by reference in its entirety.

The present invention relates to a semiconductor device and a manufacturing method thereof, and is suitably applicable to, for example, a semiconductor device having an optical waveguide and a wiring and a manufacturing method thereof.

BACKGROUND

In recent years, the silicon photonics technology has been developed. This silicone photonics technology is for coupling between an optical device and an electronic device through an optical circuit or wiring using an optical waveguide which is made of a material, such as silicon. In this manner, the optical device and the electronic device are coupled through the optical circuit or wiring. Semiconductor devices having these implemented therein are called optical communication modules.

For example, an optical signal is converted into an electric signal by a photoelectric conversion element in a photoelectric converter of the semiconductor device. The optical signal arrives at the photoelectric conversion element through the optical waveguide. The photoelectrically converted electric signal is then transmitted through wiring.

Japanese Unexamined Patent Application Publication No. 2012-27198 discloses a semiconductor device having a semiconductor layer with an intrinsic semiconductor formed over a substrate and an optical waveguide as a part of this semiconductor layer.

SUMMARY

In an optical waveguide having silicon as a material, apart of light propagated in the optical waveguide is propagated while leaking around in a region of approximately a wavelength. To eliminate propagation loss by the light leakage, the surroundings (top, bottom, right, and left) of the optical waveguide are covered with an insulating film which is formed of silicon oxide.

Thus, in an examined configuration, the lower side of the optical waveguide is covered with a thick insulating layer, with using a so-called SOI substrate.

When the electric signal is propagated using the wiring, an eddy current is generated in the substrate by a mutual interaction between the electric signal and the lower layer substrate. This eddy current disturbs signal propagation.

Any other objects and new features will be apparent from the descriptions of the present specification and the accompanying drawings.

Of preferred embodiments disclosed in the present application, brief descriptions of the representative examples are as follows.

According to an embodiment disclosed in this application, there is provided a semiconductor device a substrate, an insulating layer which is formed over the substrate, a semiconductor layer which is formed over the insulating layer, and an optical waveguide which is formed in the semiconductor layer. The substrate has a first semiconductor layer and a second semiconductor layer which is formed over the first semiconductor layer. The second semiconductor layer has a resistance higher than that of the first semiconductor layer.

According to the semiconductor device described in the representative embodiments disclosed in the present application, it is possible to improve the characteristics of the semiconductor device.

BRIEF DESCRIPTION OF THE DRAWINGS

FIG. 2 is a diagram illustrating impurity concentrations of a surface part of a p-type Si substrate into which n-type impurities are implanted.

FIG. 19 is a cross sectional view showing a configuration of a semiconductor device according to the application example 2 of the embodiment 2.

DETAILED DESCRIPTION

Figure 1:
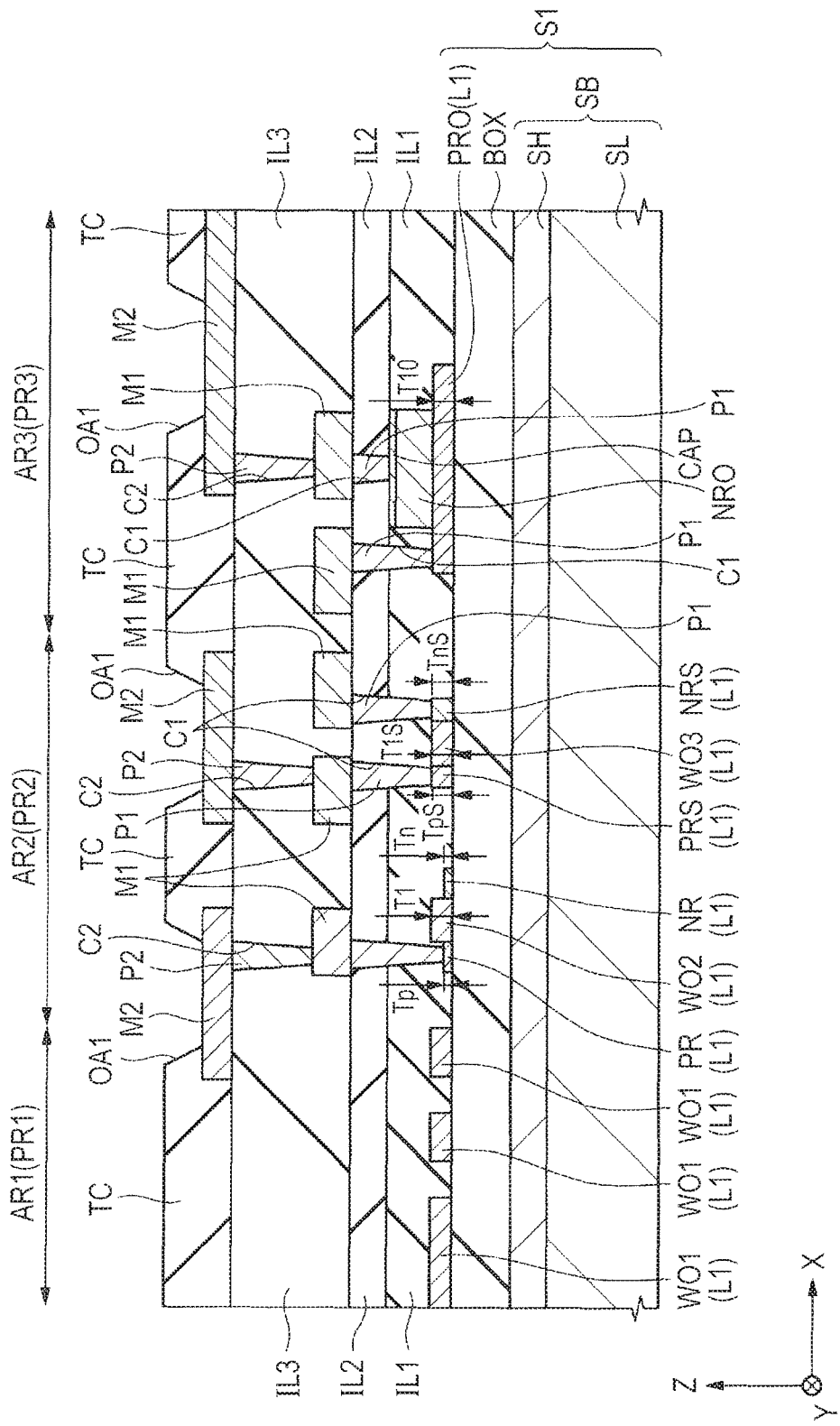
FIG. 1 is a cross sectional view showing a configuration of a semiconductor device of an embodiment 1.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of part or whole of the other. Further, in the following preferred embodiments, in the case of reference to the number of an element (including quantity, numeric value, amount, range), unless otherwise specified and/or unless clearly limited in principle, the present invention is not limited to the specified number, and a number over or below the specified one may be used.

In the following preferred embodiments, the constituent elements (including element steps) are not necessarily indispensable, unless otherwise specified and/or unless considered that they are obviously required in principle. Similarly, in the following preferred embodiments, in the reference of the forms of the constituent elements or the positional relationships, they intend to include those approximating or similar substantially to the forms and like, unless otherwise specified and/or unless considered that they are obviously not required in principle. This is also true of the foregoing numerical values (including quantity, numeric value, amount, range).

Descriptions will now specifically be made to the preferred embodiments based on the accompanying drawings. In all the drawings, the same or related numerals are given to those members having the same functions, and the descriptions thereof will not be made over and over. When there are a plurality of similar members (parts), symbols may be added to the reference numerals of the corresponding generic terms, to specify the individual or specific parts. In the following preferred embodiments, the same or similar parts are not described over and over in principle unless absolutely necessary.

In the drawings for use in the preferred embodiments, for simplicity, hatching may not be given, even in the cross sectional view.

In cross sectional views and plan views, the sizes of the parts do not correspond to those of the actual device. For simple illustration, particular parts may be illustrated in relatively a large size. In the case where the cross sectional view and the plan view correspond to each other, for simplicity, parts may be illustrated in relatively a large size.

Embodiment 1

Descriptions will now specifically be made to a semiconductor device of this embodiment with reference to the accompanying drawings.

[Descriptions on Configuration]

FIG. 1 is a cross sectional view showing a configuration of a semiconductor device of this embodiment. The semiconductor device illustrated in FIG. 1 is a semiconductor device (an optical semiconductor device) having a photoelectric conversion element which performs signal conversion between an optical signal and an electric signal. The optical signal is converted into an electric signal by this photoelectric conversion element. For example, the optical signal arrives at the photoelectric conversion element through the optical waveguide. Then, the photoelectrically converted electric signal is transmitted through the wiring.

As illustrated in FIG. 1, the semiconductor device of this embodiment has a transmission line unit PR1 for optical signals, an optical modulation unit PR2, and a photoelectric conversion unit PR3 respectively formed in areas AR1, AR2, and AR3 of an SOI (Silicon on Insulator) substrate S1. The SOI substrate S1 is formed of a substrate SB, an insulating layer (Buried Oxide) BOX formed over the substrate SB, and a semiconductor layer L1 formed over the insulating layer BOX. This semiconductor layer L1 is an element-forming layer.

The substrate (also called a supporting substrate, a semiconductor layer, or a semiconductor substrate) SB has a low resistance semiconductor layer SL and a high resistance semiconductor layer SH thereover. The high resistance semiconductor layer SH is a semiconductor layer having a higher resistance than that of the low resistance semiconductor layer SL.

As the insulating layer BOX, for example, a silicon oxide film ($SiO_2$) film may be used. The insulating layer BOX has a thickness of approximately 2 to 3 µm, for example.

This insulating layer BOX serves as a clad layer which covers the surroundings of an optical waveguide (core layer), as will be described later.

In this embodiment, as described above, the substrate SB is formed of the two semiconductor layers (the low resistance semiconductor layer SL and the high resistance layer). Descriptions will hereinafter be made to these layers.

The low resistance semiconductor layer SL is, for example, a silicon (Si) substrate containing impurities. Specifically, it is a p-type Si single crystal substrate which has the surface orientation of (100) and the resistivity of approximately 10 Ωcm. The p-type impurity concentration is approximately, for example, $1 \times 10^{15}/cm^3$.

The high resistance semiconductor layer SH is, for example, a surface part of the Si substrate containing impurities, and is a layer containing counter impurities (conductivity type impurities which are counter to the impurities contained in the low resistance semiconductor layer SL). The high resistance semiconductor layer SH is formed, for example, all over the substrate SB.

This high resistance semiconductor layer SH is a layer into which n-type impurities (for example, P and As) as counter impurities are ion-implanted, in the surface part of the Si substrate containing, for example, p-type impurities (for example, B). In this manner, with the existence of the counter impurities, the effective p-type impurity concentration decreases, and its resistance gets higher than that of the low resistance semiconductor layer SL. In other words, the high resistance semiconductor layer SH is a layer in which the effective impurity concentration is lower (the effective impurity concentration is decreased) than the low resistance semiconductor layer SL.

The layer in which the n-type impurities are ion-implanted has a thickness of, for example, approximately 5 μm. In other words, the ion implantation depth of the n-type impurities is approximately 5 μm. The effective p-type impurity concentration of the layer having the ion-implanted n-type impurities is less than $1 \times 10^{15}/cm^3$.

FIG. 2 is a diagram illustrating the impurity concentration of the surface part of the p-type Si substrate into which n-type impurities are implanted. In the surface part of the Si substrate with the p-type impurity concentration of $1 \times 10^{15}/cm^3$, phosphorus (P) as the n-type impurities is implanted with a dose amount (described later) at a temperature of 0° C. by energy of 950 keV. Then, annealing (heat treatment) is performed for ten hours at a temperature of 1200° C. At this time, the impurity distribution of the surface part of the Si substrate (that is, the high resistance semiconductor layer SH) is measured. The horizontal axis of the graph in FIG. 2 represents the depth [μm] from the surface of the Si substrate, while the vertical axis thereof represents the net doping concentration [$cm^{-3}$]. The net doping concentration (Net) represents a difference (|ND−NA|) between the donor concentration (ND) and the acceptor concentration (NA). Note that the net doping concentration (Net) of the Si substrate having the p-type impurity concentration of $1 \times 10^{15}/cm^3$ is $1 \times 10^{15}/cm^3$ (1.0E+15 $cm^{-3}$).

When the dose amount of phosphorus (P) as the n-type impurities is $4 \times 10^{11}/cm^2$ (4.0e11 $cm^{-2}$), as illustrated in a graph (a), the net doping concentration of the surface of the Si substrate is approximately $1.0 \times 10^{14}/cm^3$. From this value, the deeper the depth, the value gradually becomes larger. When the depth is approximately 5 μm, the value is approximately $6 \times 10^{14}/cm^3$. In this manner, at least in the thickness range of 5 μm in the surface part of the p-type Si substrate, the high resistance semiconductor layer SH is formed. This high resistance semiconductor layer SH has a higher resistance than that of the low resistance semiconductor layer SL. The net doping concentration decreases from the low resistance semiconductor layer SL toward the high resistance semiconductor layer SH, and the resistance increases from the low resistance semiconductor layer SL toward the high resistance semiconductor layer SH.

When the dose amount of phosphorus (P) as the n-type impurities is $4.4 \times 10^{11}/cm^2$, as illustrated in a graph (b), the net doping concentration of the surface of the Si substrate is approximately $1.0 \times 10^{12}/cm^3$. From this value, the deeper the depth, the value gradually becomes larger. When the depth is approximately 5 μm, the value is approximately $6 \times 10^{14}/cm^3$. In this manner, at least in the thickness range of 5 μm in the surface part of the p-type Si substrate, the high resistance semiconductor layer SH is formed. This high resistance semiconductor layer SH has a higher resistance than that of the low resistance semiconductor layer SL.

When the dose amount of phosphorus (P) as the n-type impurities is $4.8 \times 10^{11}/cm^2$, as illustrated in a graph (C), the net doping concentration of the surface of the Si substrate is approximately $1.0 \times 10^{14}/cm^3$. From this value, the deeper the depth, the value gradually becomes smaller. When the depth is approximately 1.5 μm, the value is approximately $2 \times 10^{12}/cm^3$. Further, from this value ($2 \times 10^{12}/cm^3$), the deeper the depth, the value gradually becomes larger. At the depth of approximately 5 μm, the value is approximately $6 \times 10^{14}/cm^3$. In the case of this graph (c), "n-turning" (to be negative) occurs in the region shallower than 1.5 μm, by implanting the n-type impurities to the Si substrate with the p-type impurities. It does not matter when the "n-turning" occurs, as long as the net doping concentration is $1 \times 10^{15}/cm^3$ as the net doping concentration (Net) of the Si substrate. In the case of the graph (c), at least in the thickness range of 5 μm in the surface part of the p-type Si substrate, the high resistance semiconductor layer SH is formed. This layer SH has a higher resistance than that of the low resistance semiconductor layer SL.

Thus, it can be said that the low resistance semiconductor layer SL has a lower effective impurity concentration than that of the high resistance semiconductor layer SH. It can be said that the low resistance semiconductor layer SL has a lower net doping concentration than that of the high resistance semiconductor layer SH. The resistance or the impurity concentration of the high resistance semiconductor layer SH can be compared with that of, for example, the back surface of the low resistance semiconductor layer SL (the surface opposite to the high resistance semiconductor layer SH).

Accordingly, the high resistance semiconductor layer SH is arranged in the surface part of the substrate SB below the insulating layer BOX, thereby restraining the eddy current generated in the substrate by an electric signal transmitted through the wiring, as will be described later. Particularly, when a high frequency current flows through the wiring, the restraining effect of the eddy current is remarkable.

An examination is now performed on the case in which the substrate SB is configured with a single layer of the low resistance semiconductor layer SL, without providing the high resistance semiconductor layer SH. Even in this case, when a high frequency current flows through the wiring, a magnetic field is generated around the wiring, and the eddy current is generated in the substrate (the low resistance semiconductor layer SL) formed below the layer. When this eddy current is generated, a magnetic field in a direction to negate the above magnetic field is generated, in accordance with Lenz's law. Then, the circuit constant of the wiring is changed, resulting in deterioration of transmission characteristic of the electric signal through the wiring.

Like this embodiment, when the surface part of the substrate SB is formed to have a high resistance, it is possible to lower the effect of the magnetic field around the wiring over the substrate SB, and thus to restrain the eddy current. This results in improving the transmission characteristic of the electric signal through the wiring. It is also possible to lower the transmission loss of the electric signal. Particularly, in a semiconductor device using a silicon photonics technique, the optical device and the electronic device are coupled through an optical circuit or wiring using an optical waveguide which is made of a material, such as silicon. Thus, the electric signal needs to be converted in accordance with the optical transmission speed (for example, 10 G bit/sec). In this signal transmission, the problem of the eddy current is remarkable. This embodiment is very effective as a measure for this problem.

Descriptions will now be made to a configuration including the transmission line unit PR1 for optical signals, the optical modulation unit PR2, and the photoelectric conversion unit PR3.

<Transmission Line Unit for Optical Signals>

The transmission line unit PR1 for optical signals is formed in the area AR1 (FIG. 1). In this area AR1, an optical waveguide WO1 is formed. The optical waveguide WO1 is formed in the semiconductor layer L1.

Specifically, the optical waveguide WO1 is formed from the semiconductor layer L1 formed over the insulating layer BOX. Note that impurities are not ion-implanted into the optical waveguide WO1. In other words, the optical waveguide WO1 is formed of an intrinsic semiconductor region, that is, an i-type region. The optical waveguides WO1 are formed in a line in the X direction (a rectangular form having the long side in the X direction). The optical waveguides WO1 are formed in a line in the Y direction (a rectangular form having the long side in the Y direction).

In the waveguide having the semiconductor layer formed of a material of, for example, silicon, apart of light propagated in the optical waveguide is propagated while leaking around approximately in the region of the optical wavelength. This light leakage causes propagation loss of an optical signal. To eliminate the propagation loss of the optical signal, the surroundings (top, bottom, right, and left) of the optical waveguide need to be covered by a layer (clad layer) having a low reflection index. Thus, on the top and bottom of the optical waveguide, for example, a thick (for example, a thickness of approximately 2 to 3 µm) silicon oxide is formed. To avoid optical interference, silicon oxide is arranged between the optical waveguides. Spaces of, for example, 5 µm are given between the optical waveguides. The refraction index of the silicon oxide is approximately 1.45.

Interlayer insulating films IL1, IL2, and IL3, and a protective film TC are formed over the optical waveguides Waveguides WO1. The interlayer insulating films IL1, IL2, and IL3 are formed of, for example, a silicon oxide film. The protective film TC is formed of, for example, a silicon oxynitride film (SiON film).

<Optical Modulation Unit>

The optical modulation unit PR2 is formed in the area AR2 (FIG. 1). In this area AR2, an element for changing the phase of light is formed. An element with a pin structure (optical modulation element) will now be described by way of example, but it is not limited to this.

In the area AR2, the optical waveguide WO2, a p-type semiconductor unit PR, and an n-type semiconductor unit NR are formed (FIG. 1). These units form an element with a pin structure (diode with a pin structure).

The optical waveguide WO2 is formed of a semiconductor layer L1 formed over the insulating layer BOX. The optical waveguide WO2 is formed in a line in the Y direction (a rectangular form having the long side in the Y direction).

On both sides of this optical waveguide WO2, semiconductor units (PR, NR) are provided. In this case, on one side (the left side in FIG. 1) of the optical waveguide WO2, the p-type semiconductor unit PR is provided. On the other side (the right side in FIG. 1) of the optical waveguide WO2, the n-type semiconductor unit NR is provided. For example, over the end parts of the optical waveguides WO1 extending in a line in the Y direction, the semiconductor units (PR, NR) are provided. Note that impurities are not ion-implanted into the optical waveguide WO2. In other words, the optical waveguide WO2 is formed of an intrinsic semiconductor, that is, an i-type region.

In this manner, the optical waveguide WO2 and a structure unit (diode with a pin structure, rib-type element) including the p-type semiconductor unit PR and the n-type semiconductor unit NR on both sides thereof are provided, thereby enabling to change the phase of light. Plugs (P1) are formed over the p-type semiconductor unit PR and the n-type semiconductor unit NR, as will be described later. In the cross sectional view of the area AR2 of FIG. 1, only the plugs P1 over the p-type semiconductor unit PR are illustrated. To these plugs (P1), a potential is applied through the wirings (for example, M1, P2, M2). That is, the wirings (for example, M1, P2, M2) are electrically coupled to the semiconductor units (PR, NR) included in the optical modulation unit.

For example, if a forward direction bias is applied to the above-described structure unit, carriers are implanted to the optical waveguide WO2. If the carriers are implanted to the optical waveguide WO2, a carrier plasma effect is induced in the optical waveguide WO2, that is, there occurs a phenomenon caused by that optically generated carriers cause to increase electron hole pairs (plasma). As a result, a refraction index in the optical waveguide WO2 is changed. If the refraction index in the optical waveguide WO2 is changed, the wavelength of light traveling in the optical waveguide WO2 is changed. Thus, the phase of light can be changed in a process of traveling in the optical waveguide WO2.

The above-described structure is processed in a rib-type (projected-type) form. The optical waveguide WO2 is formed of the semiconductor layer L1 having a thickness T1 thicker than the p-type semiconductor unit PR and the n-type semiconductor unit NR, as will be described later. The p-type semiconductor unit PR is formed of the semiconductor layer L1 having a thickness Tp containing p-type impurities. The n-type semiconductor unit NR is formed of a semiconductor layer L1 having a thickness Tn containing n-type impurities. That is, the thickness (height) of the optical waveguide WO2 is greater than the thickness (height) Tp of the p-type semiconductor unit PR. The thickness (height) T1 of the optical waveguide WO2 is greater than the thickness (height) Tn of the n-type semiconductor unit NR. The relationship of T1>Tp≈Tn is satisfied.

Like the optical waveguide WO2, an optical waveguide WO3 is formed of the semiconductor layer L1 over the insulating layer BOX. Like the optical waveguide WO2, the optical waveguide WO3 is formed in a line in the Y direction (a rectangular form having the long side in the Y direction).

As described above, on both sides of the optical waveguide WO3, semiconductor units (PRS, NRS) are provided. On one side (the left side in FIG. 1) of the optical waveguide WO3, the p-type semiconductor unit PRS is provided. On the other side (the right side in FIG. 1) of the optical waveguide WO2, the n-type semiconductor unit NRS is provided. For example, the semiconductor units (PRS, NRS) are provided over the end parts of the optical waveguide WO3 extending in a line in the Y direction. Note that impurities are not ion-implanted into the optical waveguide WO3. In other words, the optical waveguide WO3 is formed of an intrinsic semiconductor, that is, an i-type region.

In this manner, the optical waveguide WO3 and a structure unit (diode with a pin structure) including the p-type semiconductor unit PRS and the n-type semiconductor unit NRS on both sides thereof are provided, thereby enabling to change the phase of light.

For example, if a forward direction bias is applied to the above-described structure unit, carriers are implanted to the optical waveguide WO3. If the carriers are implanted to the optical waveguide WO3, a carrier plasma effect is induced in the optical waveguide WO3, that is, there occurs a phenomenon caused by that optically generated carriers cause to increase electron hole pairs (plasma). As a result, a refraction index in the optical waveguide WO3 is changed. If the refraction index in the optical waveguide WO3 is changed, the wavelength of light traveling in the optical waveguide WO3 is changed. Thus, the phase of light can be changed in a process of traveling in the optical waveguide WO3.

In the above-described structure unit, the optical waveguide WO3 is formed of the semiconductor layer L1 with a thickness T1S. The p-type semiconductor unit PRS is formed of the semiconductor layer L1 with a thickness TpS containing p-type impurities. The n-type semiconductor unit NRS is formed of the semiconductor layer L1 with a thickness TnS containing n-type impurities. In this case, the thickness (height) T1S of the optical waveguide WO3 is approximately the same as the thickness (height) TpS of the semiconductor unit PRS. The thickness (height) T1S of the optical waveguide WO3 is approximately the same as the thickness (height) TnS of the n-type semiconductor unit NRS. The relationship of T1S≈TpS≈TnS is satisfied.

A plug P1 is formed over the p-type semiconductor unit PRS. To this plug P1, a potential is applied through wirings (for example, M1, P2, M2). That is, a potential is applied to the p-type semiconductor unit PRS through the plug P1 from the wirings (for example, M1, P2, M2). The plug P1 is formed over the n-type semiconductor unit NRS. To this plug P1, a potential is applied through the wiring (for example, M1, P2, M2). That is, a potential is applied to the n-type semiconductor unit NRS through this plug P1 from the wiring (for example, M1, P2, M2).

The above-described plug P1 is formed of a conductive film embedded in a contact hole C1 provided in the interlayer insulating films IL1 and IL2. The conductive film may, for example, be a tungsten (W) film. A first layer wiring M1 is formed over the plug P1. The wiring M1 is formed of a conductive film. The conductive film may, for example, be an aluminum-copper alloy (Al—Cu alloy) film.

The interlayer insulating film IL3 is formed over the interlayer insulating film IL2 and the wiring M1. A plug P2 is formed over the wiring M1. This plug P2 is formed of a conductive film which is embedded in a contact hole C2 provided in the interlayer insulating film IL3. The conductive film may, for example, be a tungsten (W) film. A second layer wiring M2 is formed over the plug P2. The wiring M2 is formed of a conductive film. The conductive film may, for example, be an aluminum-copper alloy (Al—Cu alloy) film.

The protective film TC is formed over the insulating film IL3 and the wiring M2. The interlayer insulating films IL1, IL2, IL3 are formed of, for example, silicon oxide films. The protective film TC is formed of, for example, a silicon oxynitride film. The protective film TC over a partial area of the wiring M2 is removed, and an opening OA1 reaching the wiring M2 is formed. The wiring M2 is exposed at the bottom of the opening OA1, and the exposed part of the wiring M2 serves as a pad unit (an external coupling unit).

<Photoelectric Conversion Unit>

As illustrated in FIG. 1, the photoelectric conversion unit PR3 is formed in the area AR3. The photoelectric conversion unit PR3 converts an optical signal into an electric signal. An element (a photodiode) with a pn junction structure will now be described by way of example, but it is not limited to this.

A p-type semiconductor unit PRO and an n-type semiconductor unit NRO are formed in the area AR3. These units form an element with a pn junction structure (a diode with a pn structure).

The p-type semiconductor unit PRO is formed of a semiconductor layer L1 containing p-type impurities. A thickness (height) T1O of the p-type semiconductor unit PRO is approximately the same as a thickness (height) of the optical waveguides WO1, WO2, and WO3 and a thickness (height) of the p-type semiconductor unit PRS or the n-type semiconductor unit NRS. For example, the relationship of T1O≈T1≈T1S≈TpS≈TnS is satisfied. These thicknesses are relatively large, and form the thickness part.

The n-type semiconductor unit NRO is formed over the p-type semiconductor unit PRO. The n-type semiconductor unit NRO is formed of germanium (Ge) to which n-type impurities are introduced. A cap layer CP is formed over the n-type semiconductor unit NRO. The cap layer CAP is formed of silicon, and is formed to improve the surface roughness of germanium included in the n-type semiconductor unit NRO and to compensate for the layer thickness.

The plug P1 is formed over the p-type semiconductor unit PRO. The plug P1 is formed over the cap layer CAP over the n-type semiconductor unit NRO. With these plugs P1, it is possible to take out a direct current flowing by a photoelectromotive force effect in the pn junction unit. That is, it is possible to take out an optical signal as an electric signal from the plugs P1 through the wiring (for example, M1, P2, M2).

The above-descried plug P1 is formed of a conductive film which is embedded in the contact hole C1 provided in the interlayer insulating films IL1 and IL2. The conductive film may, for example, be a tungsten (W) film. The first layer wiring M1 is formed over the plug P1. The wiring M1 is formed of a conductive film. The conductive film may, for example, be an aluminum-copper alloy (Al—Cu alloy) film.

The interlayer insulating film IL3 is formed over the interlayer insulating film IL2 and the wiring M1. The plug P2 is formed over the wiring M1. This plug P2 is formed of a conductive film embedded in the contact hole C2 provided in the interlayer insulating film IL3. The conductive film may, for example, be a tungsten (W) film. The second layer wiring M2 is formed over the plug P2. The wiring M2 is formed of a conductive film. The conductive film may, for example, be an aluminum-copper alloy (Al—Cu alloy) film. An insulating film (for example, silicon oxide) of 2 to 3 μm is preferably arranged between the wirings M1 and M2, to lower the parasitic capacitance. In this manner, the wiring (for example, M1, P2, M2) is electrically coupled to the semiconductor unit included in the element.

The protective film TC is formed over the interlayer insulating film IL3 and the wiring M2. The interlayer insulating films IL1, IL2, and IL3 are formed of, for example, silicon oxide films. The protective film TC is formed of, for example, a silicon oxynitride film. The infraction index of the silicon oxynitride film (SiON film) is approximately 1.82. The protective film TC over a partial area of the wiring M2 is removed, and an opening OA1 reaching the wiring M2 is formed. The wiring M2 is exposed at the bottom of the opening OA1, and the exposed part of the wiring M2 serves as a pad unit (an external coupling unit).

[Description of Manufacturing Method]

Descriptions will now be made to a manufacturing method of the semiconductor device of this embodiment, and made clearly to a structure of the semiconductor device of this embodiment.

FIG. 3 to FIG. 11 are cross sectional views each showing a manufacturing process of the semiconductor device of this embodiment.

Figure 3:
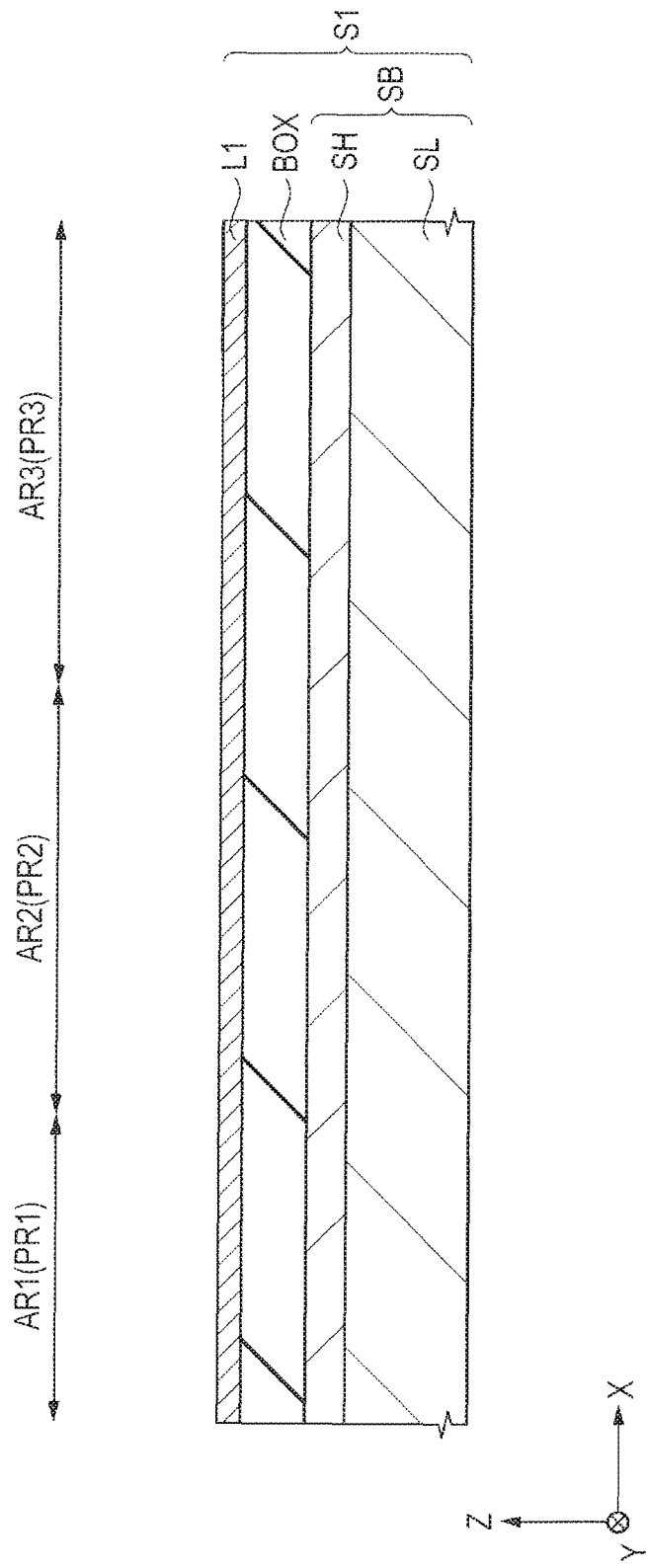
FIG. 3 is a cross sectional view showing a manufacturing process of the semiconductor device of the embodiment 1.

As illustrated in FIG. 3, there is prepared the SOI substrate Si having the insulating layer BOX formed over the substrate SB and the semiconductor layer L1 formed over the insulating layer BOX. The substrate SB has the low resistance semiconductor layer SL and the high resistance semiconductor layer SH thereover. The high resistance semiconductor layer SH is a silicon (Si) substrate containing p-type impurities of approximately $1 \times 10^{15}/cm^3$. The low resistance semiconductor layer SL is a layer in which an effective impurity concentration is lower than that of the low resistance semiconductor layer SL. In other words, the low resistance semiconductor layer SL has a net doping concentration which is lower than that of the high resistance semiconductor layer SH.

In this manner, the high resistance semiconductor layer SH is arranged below the insulating layer BOX, thereby restraining the eddy current generated in the substrate SB and improving the transmission characteristic of the electric signal of the wiring (M1, M2), as will be described later.

Figure 4:
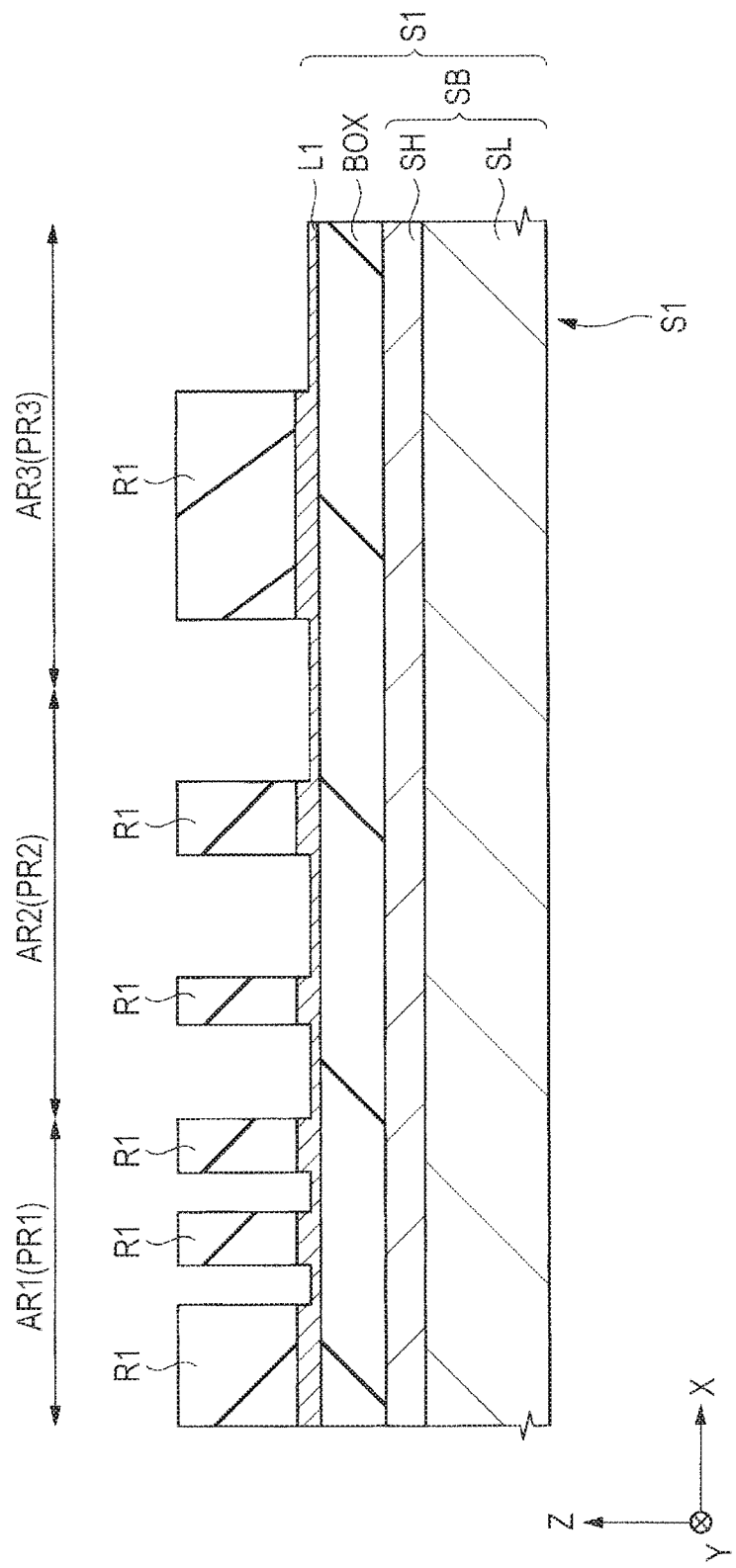
FIG. 4 is a cross sectional view showing a manufacturing process of the semiconductor device of the embodiment 1, and is a cross sectional view showing a manufacturing process following that of FIG. 3.

As illustrated in FIG. 4, there is formed a thick film unit (semiconductor layer L1) for forming the optical waveguides WO1, WO2, WO3, the p-type semiconductor unit PRS, the n-type semiconductor unit NRS, and the p-type semiconductor unit PRO. First, a photoresist film R1 is applied over the entire surface of the SOI substrate S1. Then, the photoresist film R1 is made to remain in the formation regions of the p-type semiconductor unit PRO, the optical waveguides WO1, WO2, WO3, the p-type semiconductor unit PRS, and the n-type semiconductor unit NRS, using photolithography (exposure, developing).

Figure 5:
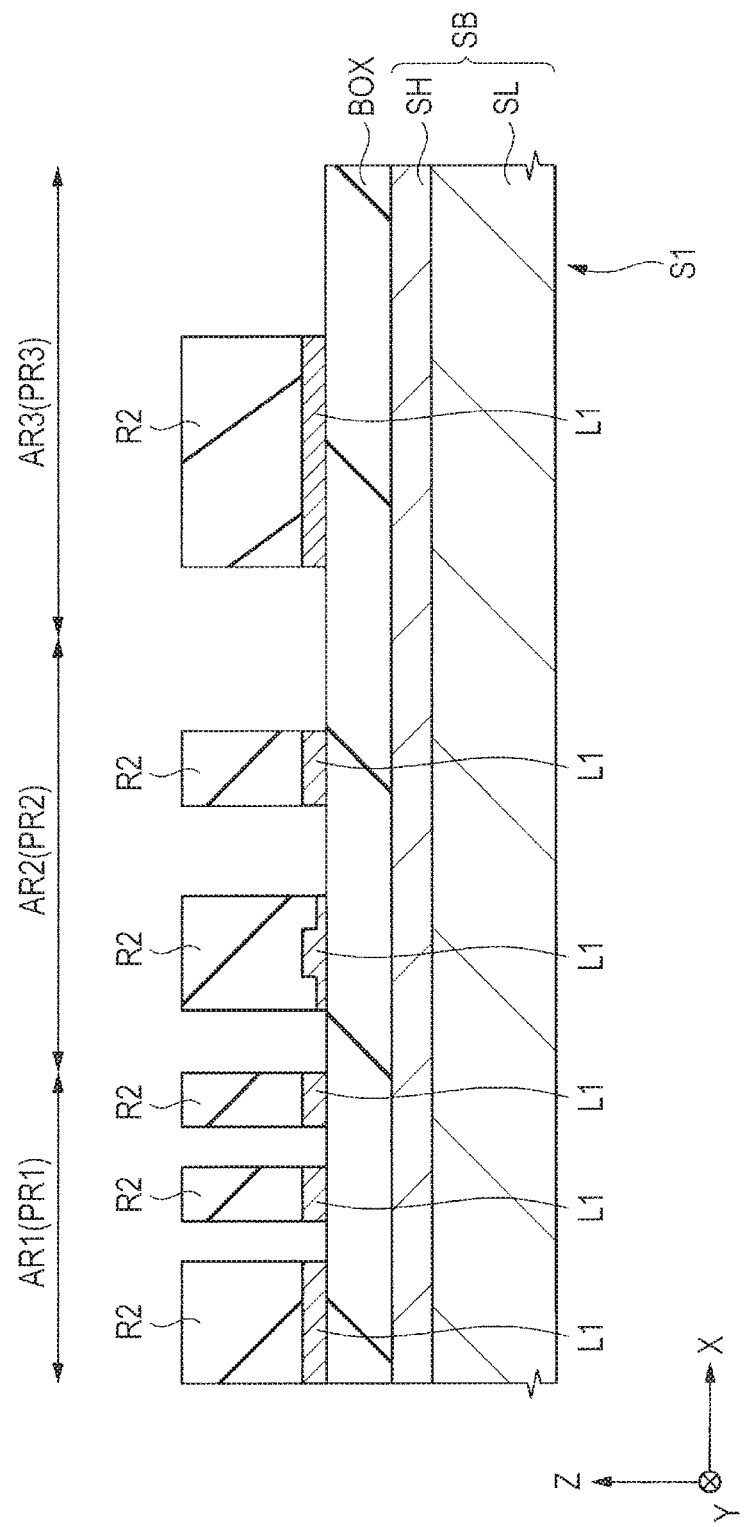
FIG. 5 is a cross sectional view showing a manufacturing process of the semiconductor device of the embodiment 1, and is a cross sectional view showing a manufacturing process following that of FIG. 4.

After the photoresist film R1 is removed by asking, as illustrated in FIG. 5, there is formed the semiconductor layer L1 for forming the optical waveguides WO1, WO2, the p-type semiconductor unit PR, the n-type semiconductor unit NR, the optical waveguide WO3, the p-type semiconductor unit PRS, the n-type semiconductor NRS, and the p-type semiconductor unit PRO. A photoresist film R2 is applied over the entire surface of the SOI substrate SI. The photoresist film R2 is made to remain in the formation regions of the optical waveguides WO1, WO2, the p-type semiconductor unit PR, the n-type semiconductor unit NR, the optical waveguide WO3, the p-type semiconductor unit PRS, the n-type semiconductor unit NRS, and the p-type semiconductor unit PRO, using photolithography (exposure, developing). The semiconductor layer L1 is dry etched until the surface of the insulating layer BOX is exposed, using the photolithography film R2 as a mask.

According to the above process, it is possible to form the semiconductor layer L1 for forming the optical waveguides WO1, WO2, the p-type semiconductor unit PR, the n-type semiconductor unit NR, the optical waveguide WO3, the p-type semiconductor unit PRS, the n-type semiconductor unit NRS, and the p-type semiconductor unit PRO. Note that, at this stage, the semiconductor layer L1 remains intrinsic (i-type).

Figure 6:
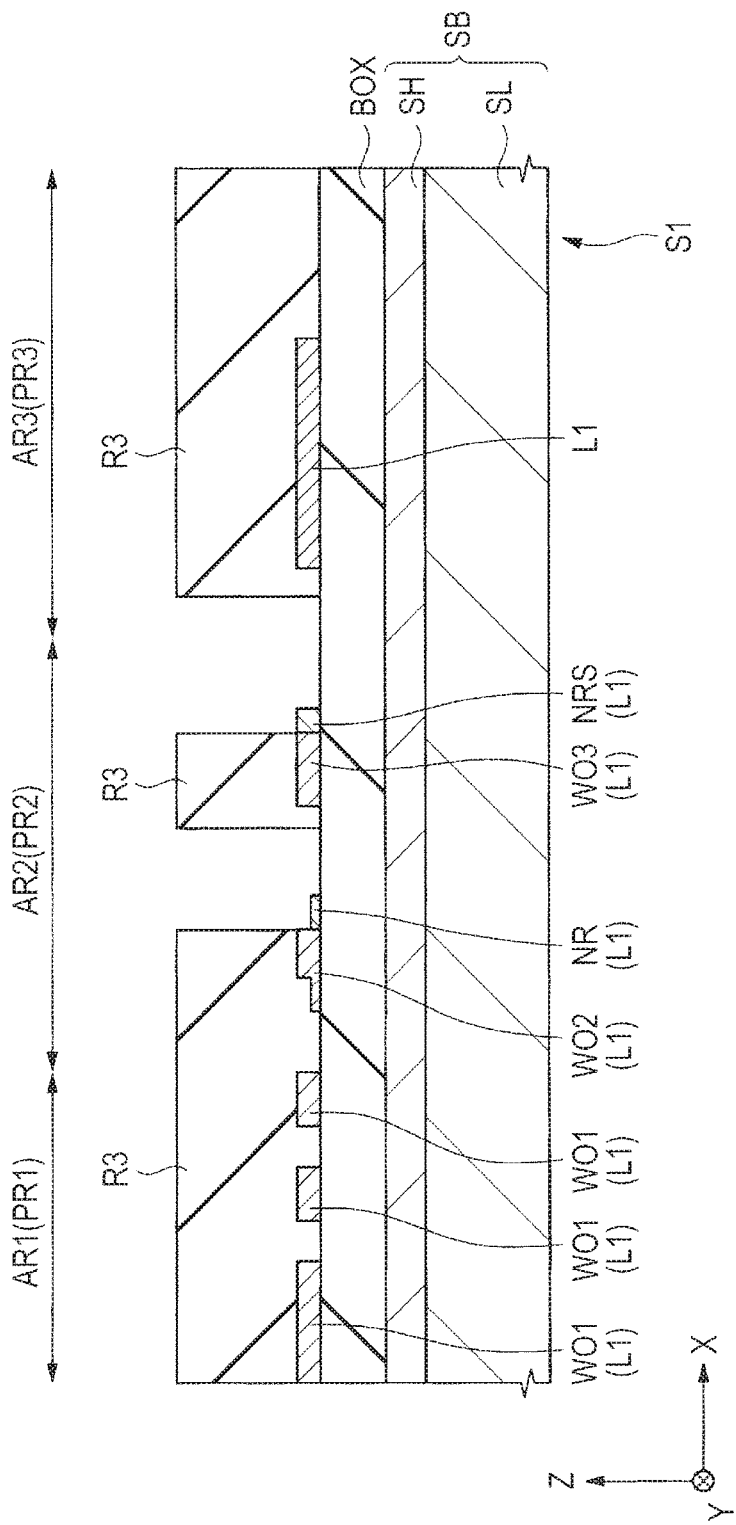
FIG. 6 is a cross sectional view showing a manufacturing process of the semiconductor device of the embodiment 1, and is a cross sectional view showing a manufacturing process following that of FIG. 5.
Figure 7:
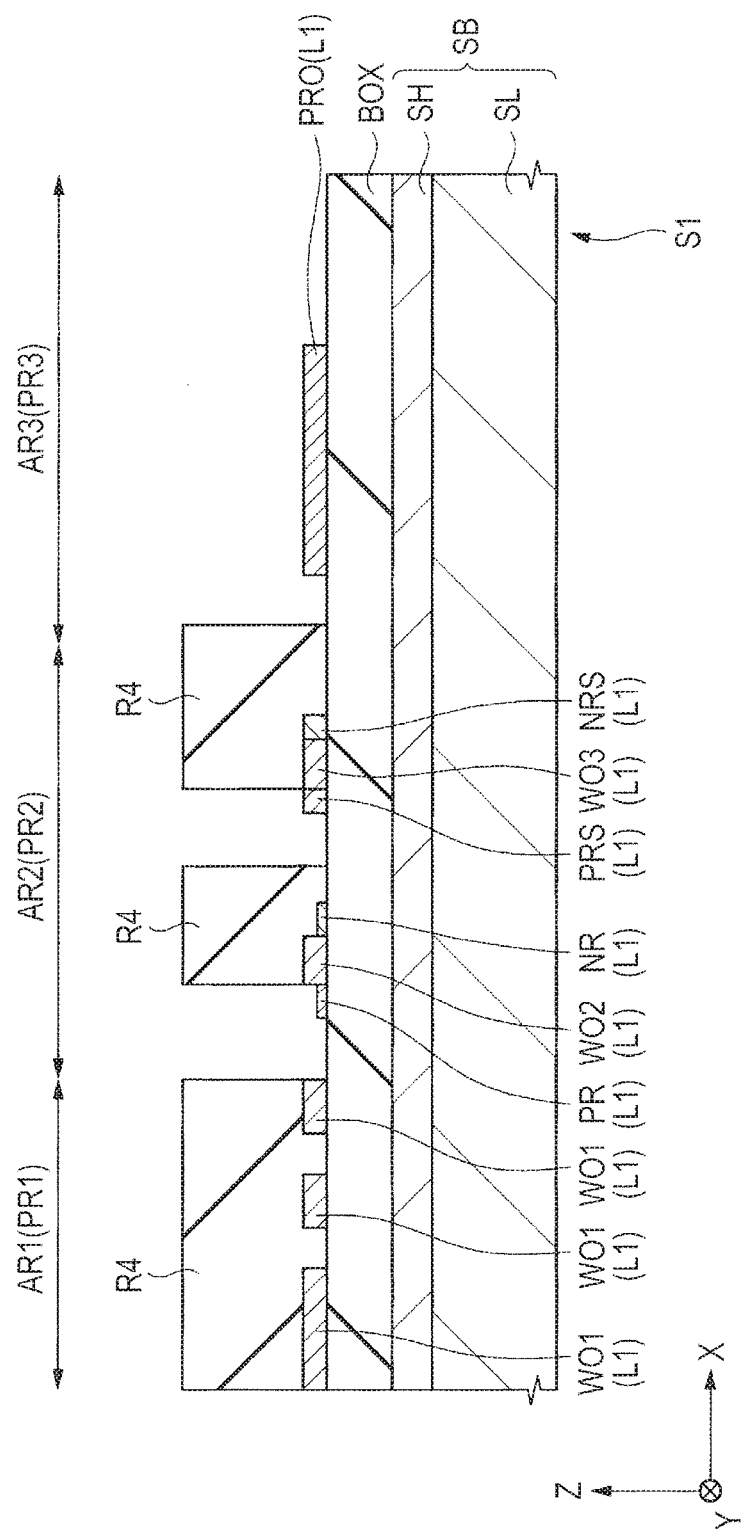
FIG. 7 is a cross sectional view showing a manufacturing process of the semiconductor device of the embodiment 1, and is a cross sectional view showing a manufacturing process following that of FIG. 6.

As illustrated in FIG. 6 and FIG. 7, impurities are ion-implanted to the semiconductor layer L1 on both sides of the optical waveguide WO2, to form the p-type semiconductor unit PR and the n-type semiconductor unit NR. Impurities are ion-implanted to the semiconductor layer L1 on both sides of the optical waveguide WO3, to form the p-type semiconductor unit PRS and the n-type semiconductor unit NRS. Impurities are ion-implanted to the area A3, to form the p-type semiconductor unit PRO.

As illustrated in FIG. 6, a photoresist film R3 having an opening is formed using photolithography (exposure, developing). This film R3 is formed over the semiconductor layer L1 of one side (for example, the right side in FIG. 6) of the optical waveguide WO2 and over the semiconductor layer L1 of one side (for example, the right side in FIG. 6) of the optical waveguide WO3. Next, n-type impurities are ion-implanted, using the photoresist film R3 as a mask. As a result, the n-type semiconductor units NR and NRS can be formed.

After the photoresist film R3 is removed by asking, as illustrated in FIG. 7, there is formed a photoresist film R4 having an opening using photolithography (exposure, developing). This film R4 is formed over the semiconductor layer L1 of the other side (for example, the left side in FIG. 7) of the optical waveguide WO2, over the semiconductor layer L1 of the other side (for example, the left side of FIG. 7) of the optical waveguide WO3, and over the semiconductor layer L1 of the photoelectric conversion unit PR3. Next, n-type impurities are ion-implanted, using the photoresist film R4 as a mask. As a result, the p-type semiconductor unit PR, the p-type semiconductor unit PRS, and the p-type semiconductor unit PRO can be formed.

After the p-type impurities and n-type impurities are introduced, heat treatment may be performed to activate the introduced impurity ions.

Figure 8:
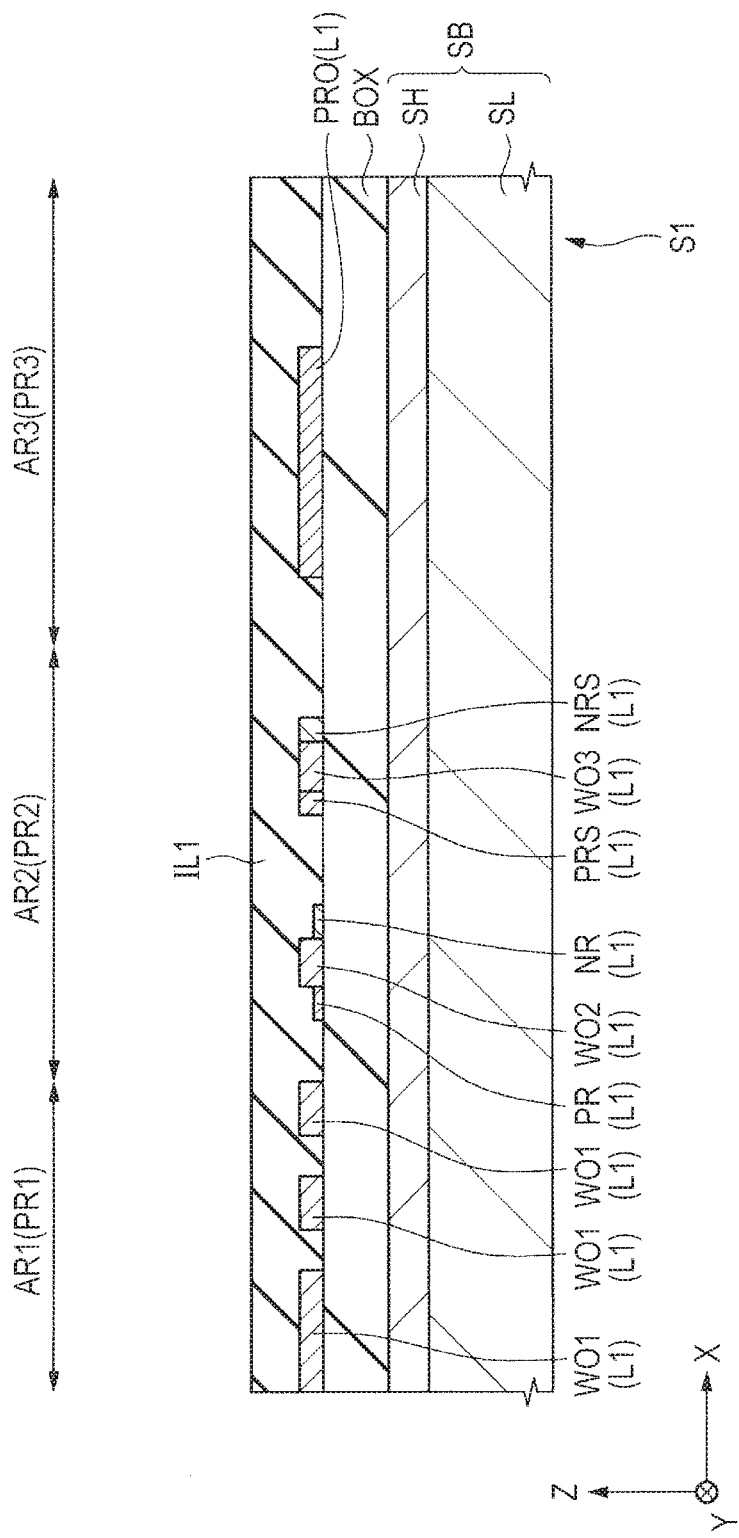
FIG. 8 is a cross sectional view showing a manufacturing process of the semiconductor device of the embodiment 1, and is a cross sectional view showing a manufacturing process following that of FIG. 7.

As illustrated in FIG. 8, the interlayer insulating film IL1 is formed over the optical waveguides WO1, WO2, WO3, and the p-type semiconductor unit PRO. For example, a silicon oxide film is formed using a CVD method, over the optical waveguides WO1, WO2, WO3, and the p-type semiconductor unit PRO. Next, the upper surface of the interlayer insulating film IL1 is planarized, as needed. The surface part of the interlayer insulating film IL1 is planarized by polishing, using, for example, a CMP (Chemical Mechanical Polishing) method.

Figure 9:
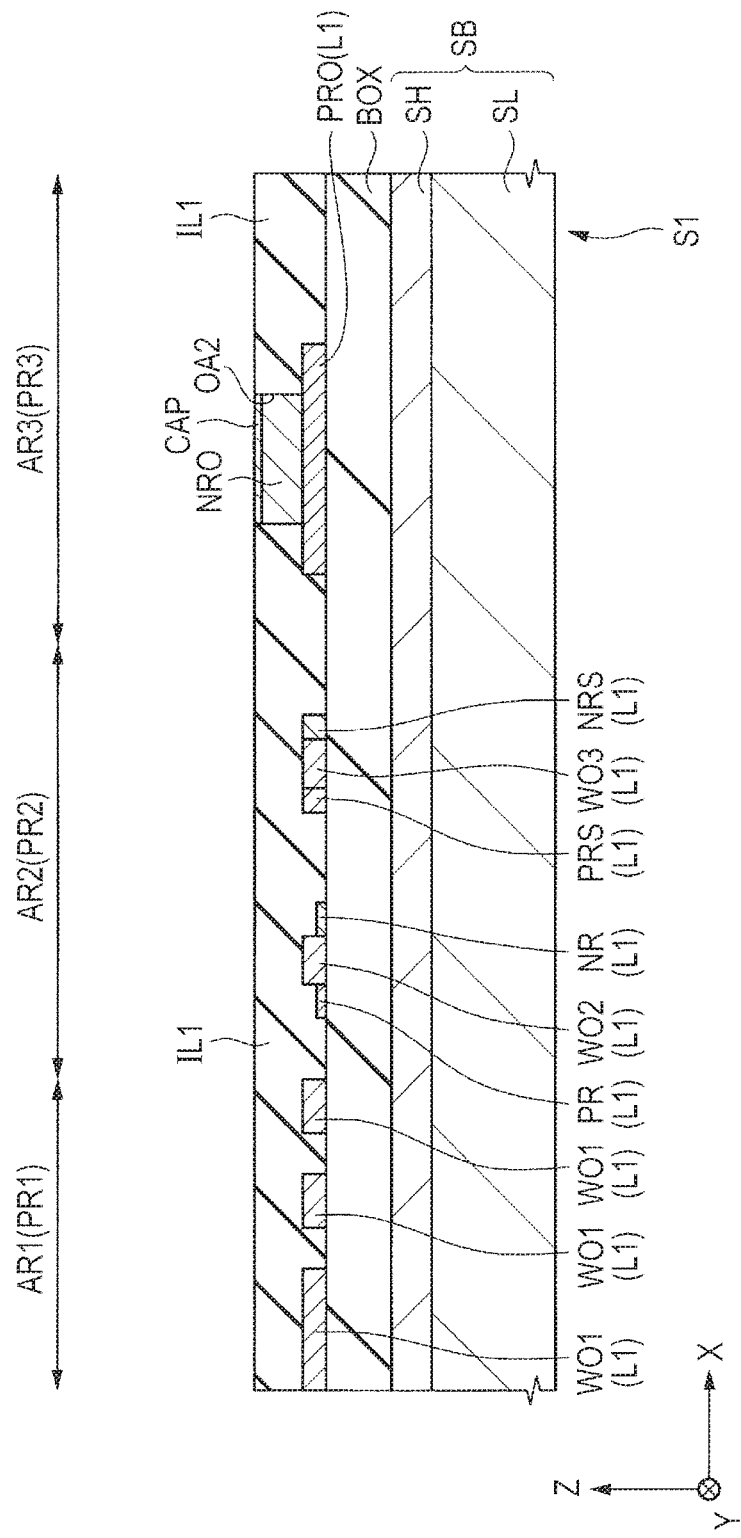
FIG. 9 is a cross sectional view showing a manufacturing process of the semiconductor device of the embodiment 1, and is a cross sectional view showing a manufacturing process following that of FIG. 8.

As illustrated in FIG. 9, the n-type semiconductor unit NRO and the cap layer CAP are formed over the p-type semiconductor unit PRO.

First, the interlayer insulating film IL1 over the p-type semiconductor units PR and PRO is removed, using the photolithography technique and the etching technique, thereby forming an opening OA2 over the p-type semiconductor unit PRO. At the bottom of this opening OA2, the p-type semiconductor PRO formed of silicon is exposed. The n-type semiconductor unit NRO formed of Ge is formed over the exposed surface of the p-type semiconductor unit PRO. Over the p-type semiconductor unit PRO, while n-type impurities are introduced, the semiconductor layer formed of Ge is epitaxial grown. After the intrinsic semiconductor layer formed of Ge is epitaxial grown, n-type impurities may be introduced using an ion implantation method. As a result, there is formed an element with a pn junction structure including the p-type semiconductor unit PRO and the n-type semiconductor unit NRO formed of Ge.

Next, a cap layer CAP is formed over the n-type semiconductor unit NRO. As described above, the cap layer CAP is formed to reform the surface roughness of Ge of the n-type semiconductor unit NRO, or to compensate for the layer thickness. For example, over the n-type semiconductor unit NRO, an n-type silicon film is formed as the cap layer CAP. For example, over the n-type semiconductor unit NRO, after the semiconductor film formed of silicon is epitaxial grown, n-type impurities are introduced to the semiconductor film using the ion implantation method, thereby forming the cap layer CAP.

Figure 10:
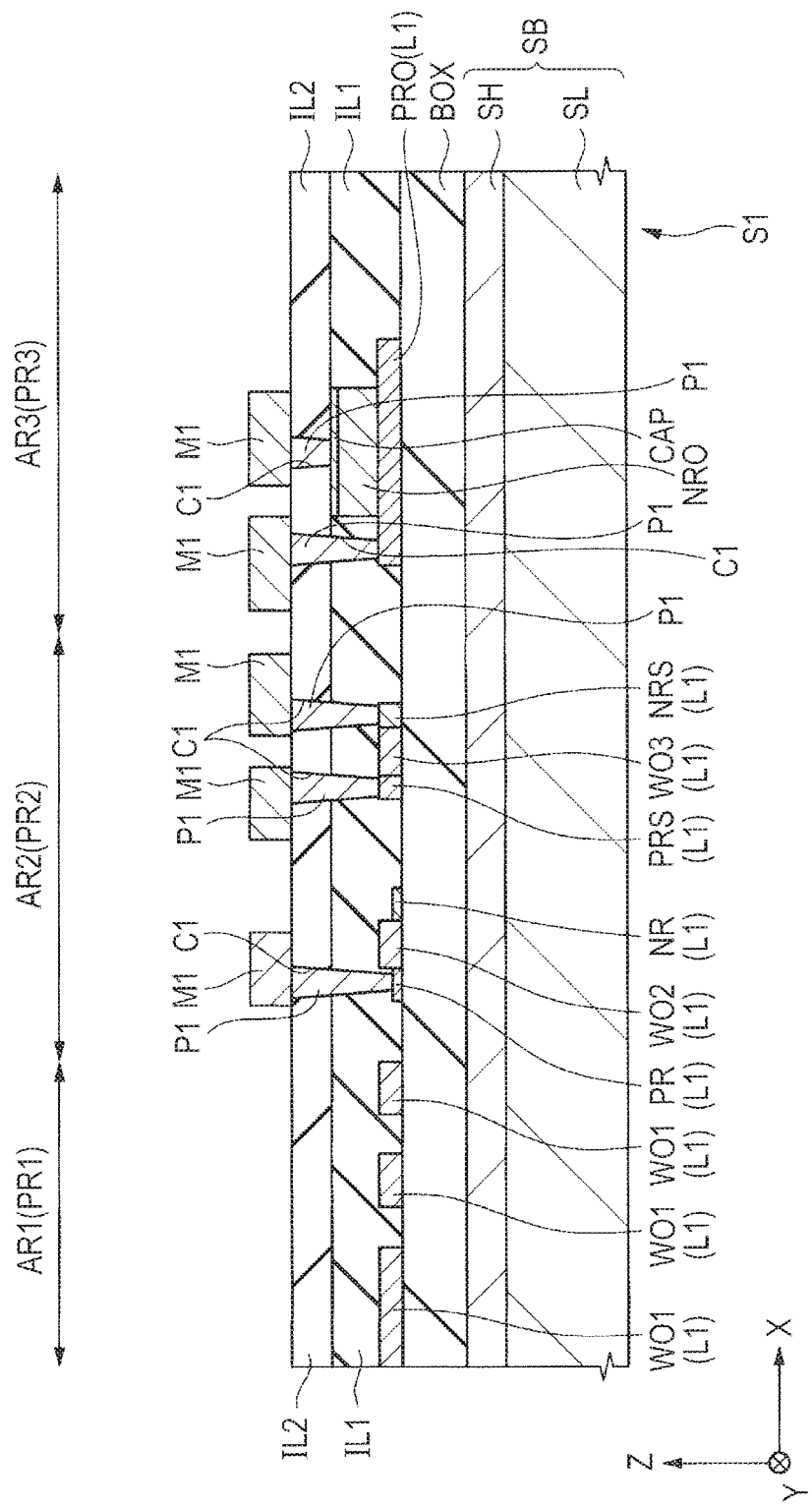
FIG. 10 is a cross sectional view showing a manufacturing process of the semiconductor device of the embodiment 1, and is a cross sectional view showing a manufacturing process following that of FIG. 9.

As described in FIG. 10, the interlayer insulating film IL2, the plug P1, and the wiring M1 are formed. Over the interlayer insulating film IL1 and the cap layer CAP, the interlayer insulating film IL2 is formed. For example, over the interlayer insulating film IL1 and the cap layer CAP, a silicon oxide film is formed using a CVD method as the interlayer insulating film IL2. As a result, in the areas AR1, AR2, and AR3, the optical waveguides WO1, WO2, the p-type semiconductor unit PR, the n-type semiconductor unit NR, the optical waveguide WO3, the p-type semiconductor unit PRS, the n-type semiconductor unit NRS, the p-type semiconductor unit PRO, and the n-type semiconductor unit NRO are enclosed by the interlayer insulating films IL1, IL2, and the insulating layer BOX.

Using the photolithography technique and the etching technique, the interlayer insulating layers IL1 and IL2 are removed, thereby forming the contact hole C1 thereover. These layers IL1 and IL2 are formed over the p-type semiconductor unit PRS, the n-type semiconductor unit NRS, the p-type semiconductor unit PRO, and the cap layer CAP. Though not illustrated in FIG. 10, a contact hole may be formed also over the n-type semiconductor unit NR.

A conductive film is embedded inside the contact hole C1, thereby forming the plug P1. For example, a tungsten film is formed using a sputtering method, over the interlayer insulating film IL2 including the contact hole C1. Then, the tungsten film over the interlayer insulating film IL2 is removed using the CMP method, thereby embedding the tungsten film inside the contact hole C1.

A conductive film is formed and patterned over the plug P1, thereby forming the wiring M1. For example, an aluminum-copper alloy film is formed using a sputtering method over the plug P1 and the interlayer insulating film IL2. This aluminum-copper alloy film is patterned, thereby enabling to form the wiring M1. In this case, the wiring M1 is formed by patterning. However, the wiring M1 may be formed using so-called a damascene method. In this case, an insulating film having an opening (a wiring trench) is formed over the plug P1, and a conductive film is embedded in the opening, thereby forming the wiring M1.

Figure 11:
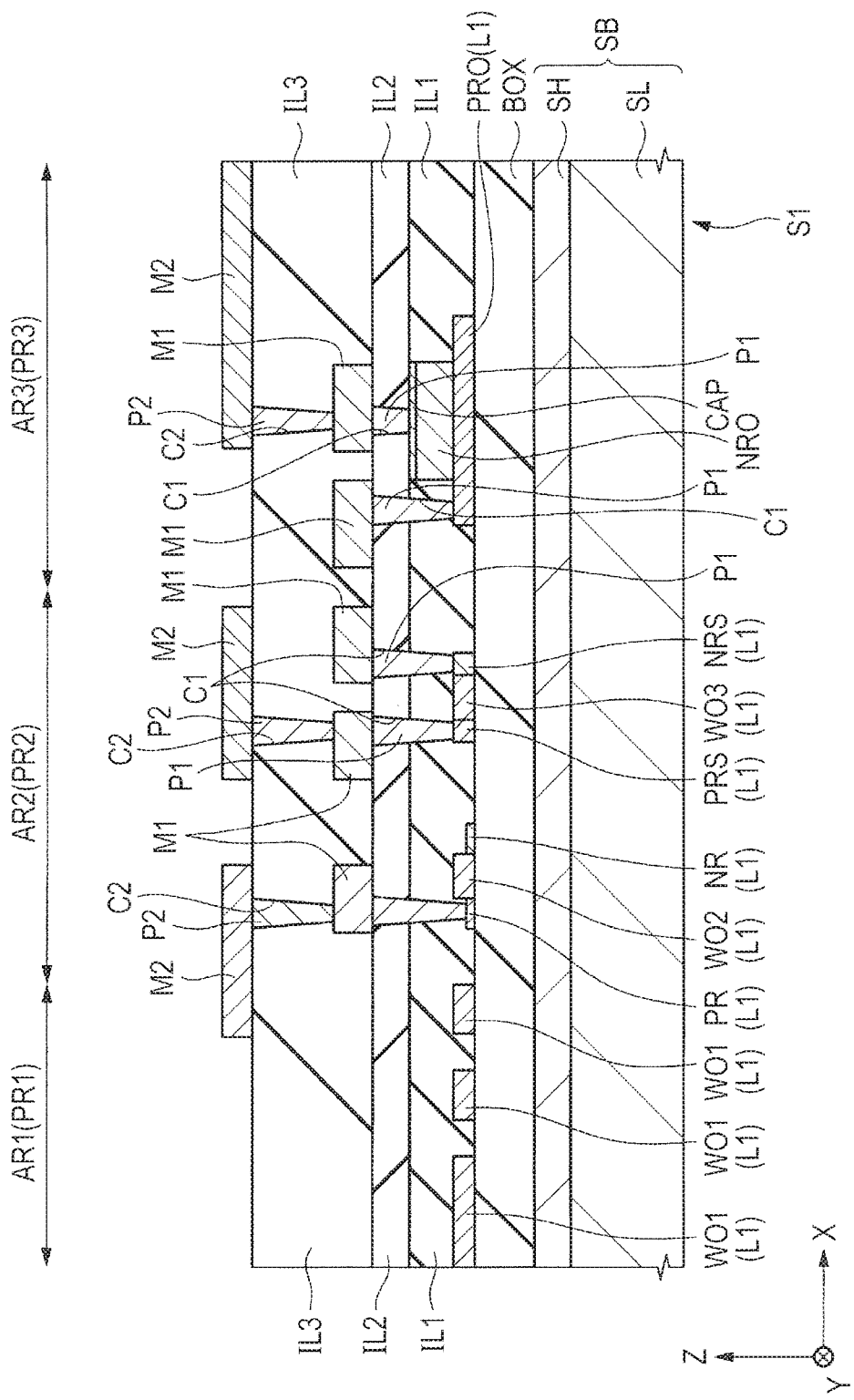
FIG. 11 is a cross sectional view showing a manufacturing process of the semiconductor device of the embodiment 1, and is a cross sectional view showing a manufacturing process following that of FIG. 10.

As illustrated in FIG. 11, the interlayer insulating film IL3, the plug P2, and the wiring M2 are formed. First, the interlayer insulating film IL3 is formed over the interlayer insulating film IL2 and the wiring M1. For example, a silicon oxide film is formed as the interlayer insulating film IL3 over the interlayer insulating film IL2 and the wiring M1, using the CVD method. Next, using the photolithography technique and the etching technique, the interlayer insulating film IL3 over the wiring M1 is removed, thereby forming the contact hole C2 over the wiring M1. Then, a conductive film is embedded in the contact hole C2, thereby forming the plug P2. For example, like the case of the plug P1, the plug P2 can be formed. The wiring M2 is formed over the plug P2. For example, like the case of the wiring M1, the wiring M2 can be formed. The wiring M2 may be formed using so-called a damascene method. In this case, the plug P2 and the wiring M2 may be formed at the same time, using so-called a dual damascene method, specifically by embedding the contact hole and the wiring trench at the same time.

After this, the protective film TC is formed over the wiring M2, to further form a pad unit. For example, a silicon oxynitride film is formed using the CVD method as a protective film TC, over the interlayer insulating film IL3 and the wiring M2. Using the photolithography technique and the etching technique, the protective film TC over the wiring M2 is removed, thereby exposing the surface of the wiring M2. The exposed area of the wiring M2 serves as a pad unit (external coupling area) (FIG. 1). The descriptions have been made to the configuration in which two wirings (M1, M2) are provided below the protective film TC. However, multiple layers may further be formed.

(Manufacturing Method of SOI Substrate)

Though no particular restriction is made to the formation method of the SOI substrate S1 illustrated in FIG. 3, the following formation is possible, for example.

First Example

FIGS. 12A-12C and FIGS. 13A-13B are cross sectional views each showing a first example of a manufacturing method of an SOI substrate of this embodiment.

Figure 12A:
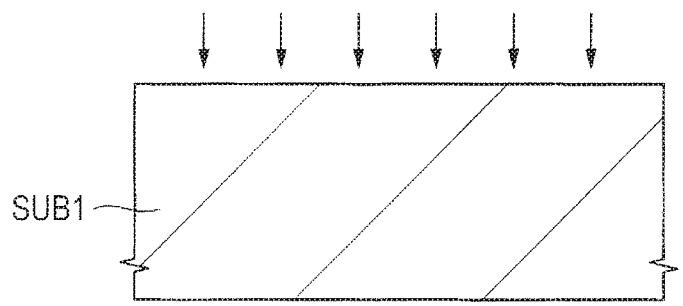
FIGS. 12A-12C are cross sectional views each showing a first example of a manufacturing method of an SOI substrate of the embodiment 1.
Figure 12B:
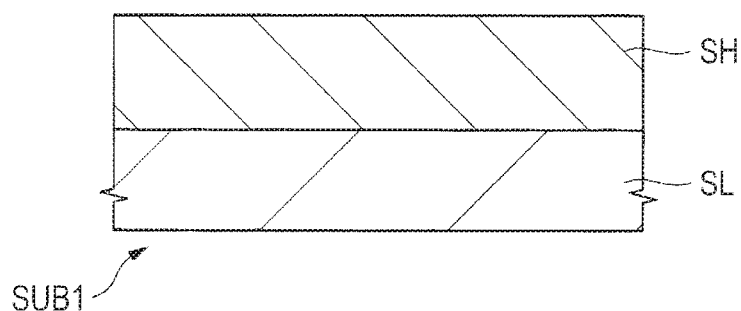

There is prepared a p-type first silicon substrate SUB1 illustrated in FIG. 12A. N-type impurities are implanted to its surface part, and heat treatment is performed therefor, thereby forming a high resistance semiconductor layer SH (FIG. 12B). For example, as illustrated in the embodiment 1, in the surface part of the Si substrate with the p-type impurity concentration of $1 \times 10^{15}/cm^3$, phosphorus (P) as the n-type impurities is implanted with a dose amount of $4 \times 10^{11}/cm^2$ to $4.4 \times 10^{11}/cm^2$. Then, annealing (heat treatment) is performed for ten hours at a temperature of 1200° C.

At this time, the low resistance part of the p-type first silicon substrate SUB1 serves as a low resistance semiconductor layer SL. In this manner, by the ion-implantation and the heat treatment process, it is possible to obtain an SOI substrate in which the p-type impurity concentration has a gentle profile. In other words, it is possible to obtain the SOI substrate in which the p-type impurity concentration gently decreases, from the surface of the low resistance semiconductor layer SL toward the high resistance semiconductor layer SH.

Figure 12C:
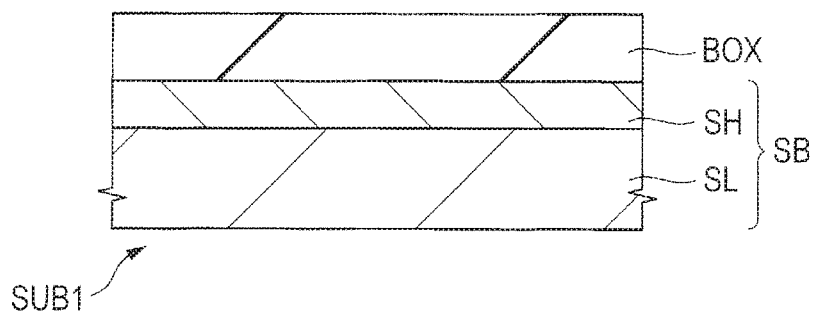

As illustrated in FIG. 12C, the surface of the high resistance semiconductor layer SH oxidizes, to form an insulating layer BOX formed of a silicon oxide film. The insulating layer BOX has a thickness of, for example, approximately 2 to 3 μm.

Figure 13A:
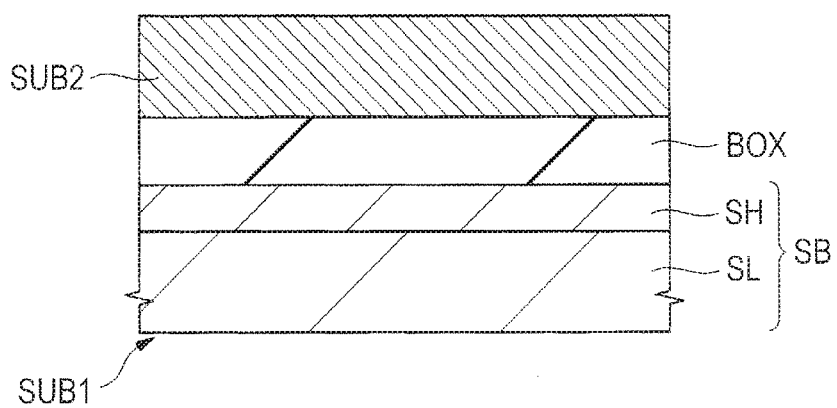
FIGS. 13A-13B are cross sectional views each showing the first example of the manufacturing method of the SOI substrate of the embodiment 1.
Figure 13B:
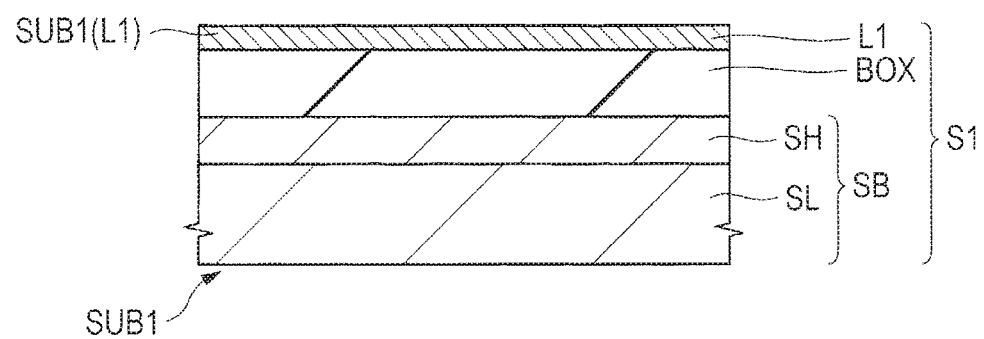

As illustrated in FIG. 13A, a second silicon substrate SUB2 is press-bonded, at a high temperature, to the surface side of the first silicon substrate SUB1, via the insulating layer BOX. After this, as illustrated in FIG. 13B, the second silicon substrate SUB2 is used as the upper surface, and it is made thin using the CMP method. In this case, the thin film of the second silicon substrate SUB2 remains over the insulating layer BOX. This thin film serves as the semiconductor layer L1. The thin film (L1) of the second silicon substrate SUB2 has a thickness of approximately, for example, 300 nm.

In this manner, it is possible to form the SOI substrate S1 (FIG. 3) which is formed of the semiconductor layer L1, the insulating layer BOX, and a laminated unit of the high resistance semiconductor layer SH and the low resistance semiconductor layer SL for forming the substrate SB.

Second Example

Figure 14A:
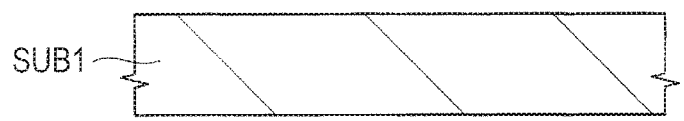
FIGS. 14A-14C are cross sectional views each showing a second example of the manufacturing method of the SOI substrate of the embodiment 1.
Figure 14B:
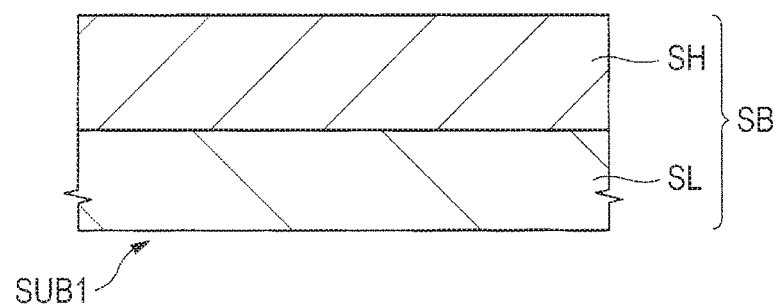
Figure 14C:
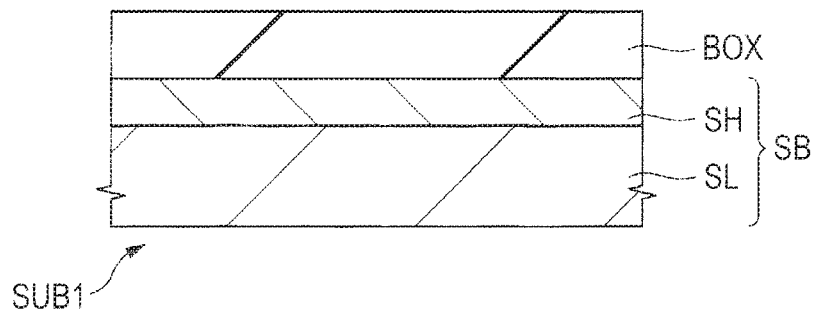

FIGS. 14A-14C are cross sectional views each showing a second example of a manufacturing method of the SOI substrate of this embodiment.

There is prepared a p-type first silicon substrate SUB1 illustrated in FIG. 14A. In its surface part, a p-type semiconductor layer with a concentration lower than that of the p-type first silicon substrate SUB1 is epitaxial grown. In other words, the semiconductor layer (for example, silicon) is epitaxial grown while doping p-type impurities at a low concentration. As a result, the high resistance semiconductor layer SH is formed (FIG. 14B). While the doping amount of the p-type impurities is changed in stages, a plurality of p-type semiconductor layers may be formed. In this case, it is possible to obtain the SOI substrate in which the p-type impurity concentration decreases in steps.

In this case, the p-type first silicon substrate SUB1 serves as a low resistance semiconductor layer SL. Then, as illustrated in FIG. 14C, the surface of the high resistance semiconductor layer SH oxidizes, to form an insulating layer BOX formed of a silicon oxide film is formed. The insulating layer BOX has a thickness of, for example, approximately 2 to 3 µm.

Like the case of the application example 1, a second silicon substrate SUB2 is press-bonded, at a high temperature, to the surface side of the first silicon substrate SUB1 through the insulating layer BOX (see FIG. 13A). After this, like the case of the application example 1, the second silicon substrate SUB2 is used as the upper surface, and it is made thin, using the CMP method. In this case, the thin film of the second silicon substrate SUB2 remains over the insulating layer BOX (see FIG. 13B). This thin film serves as the semiconductor layer L1. The thin film (L1) of the second silicon substrate SUB2 has a thickness of, for example, approximately 300 nm.

In this manner, it is possible to form an SOI substrate S1 (FIG. 3) which is formed of the semiconductor layer L1, the insulating layer BOX, and a laminated unit of the high resistance semiconductor layer SH and the low resistance semiconductor layer SL for forming a substrate SB.

Third Example

Figure 15A:
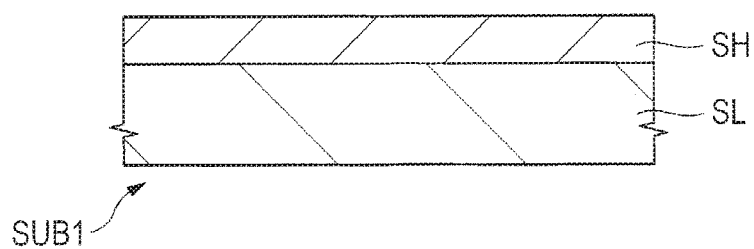
FIGS. 15A-15C are cross sectional views each showing a third example of the manufacturing method of the SOI substrate of the embodiment 1.
Figure 15B:
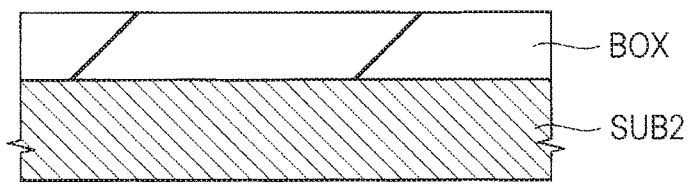
Figure 15C:
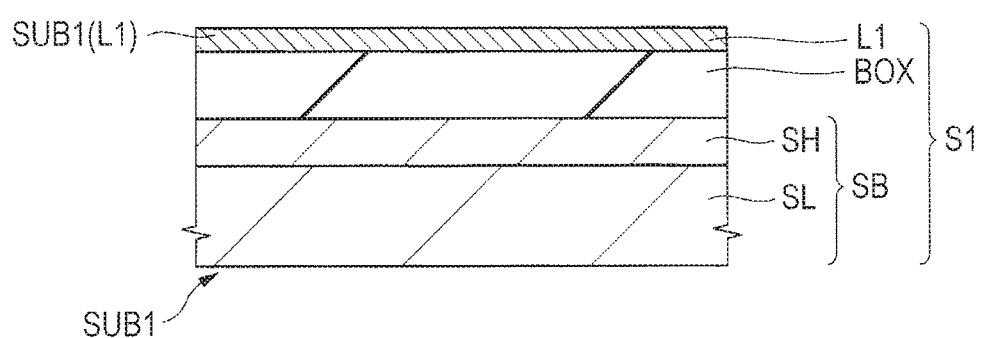

In the above-described first example and the second example, the surface of the high resistance semiconductor layer SH oxidizes, to form an insulating layer BOX formed of a silicon oxide film is formed. However, the insulating layer BOX formed of the silicon oxide film may be formed on the side of the second silicon substrate SUB2. FIGS. 15A-15C are cross sectional views each showing a third example of a manufacturing method of the SOI substrate of this embodiment.

There is prepared a first silicon substrate SUB1 having a low resistance semiconductor layer SL and a high resistance semiconductor layer SH thereover, as illustrated in FIG. 15A. As a formation method of the high resistance semiconductor layer SH, it is possible to use an ion implantation method described in the application example 1. In addition, it may be formed using the epitaxial method described in the application example 2. Next, as illustrated in FIG. 15B, the second silicon substrate SUB2 is prepared, and its surface oxidizes, to form the insulating layer BOX formed of a silicon oxide film. The insulating layer BOX has a thickness of, for example, approximately 2 to 3 µm.

Next, the high resistance semiconductor layer SH on the surface side of the first silicon substrate SUB1, illustrated in FIG. 15A, is press-bonded to the insulating layer BOX on the surface side of the second silicon substrate SUB2, illustrated in FIG. 15B, at a high temperature. After this, the second silicon substrate SUB2 is used as the upper surface, and is it made thin, using the CMP method. In this case, the thin film of the second silicon substrate SUB2 remains over the insulating layer BOX, and serves as the semiconductor layer L1. The thin film (L1) of this second silicon substrate SUB2 has a thickness of, for example, approximately 300 nm (see FIG. 15C).

In this manner, it is possible to form the SOI substrate SI (FIG. 3) which is formed of the semiconductor layer L1, the insulating layer BOX, and a laminated unit of the high resistance semiconductor layer SH and the low resistance semiconductor layer SL for forming the substrate SB.

Embodiment 2

In the embodiment 1, the high resistance semiconductor layer SH is formed as a layer (single layer) containing counter impurities. However, this layer may be formed with a pn junction configuration.

Figure 16:
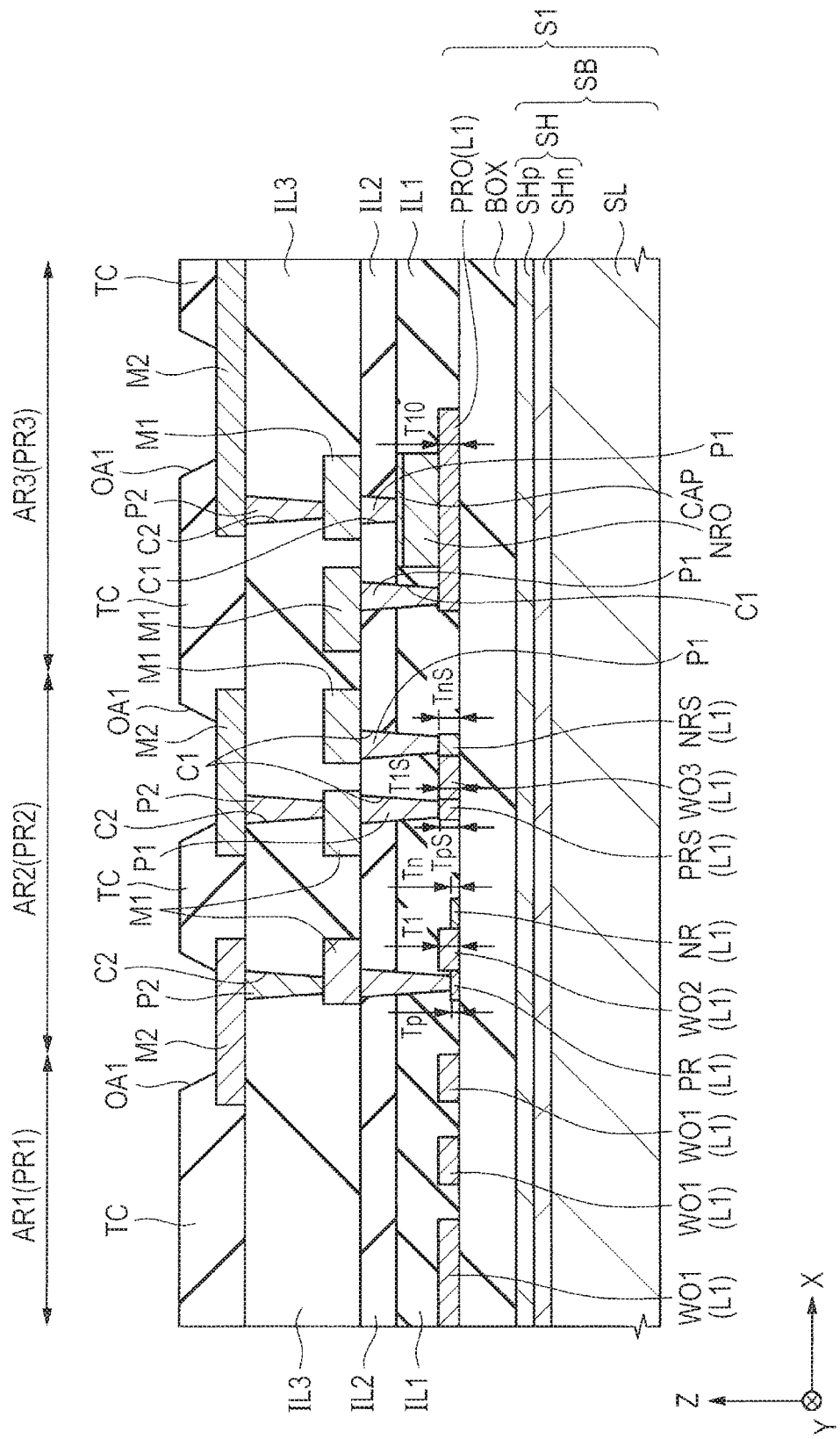
FIG. 16 is a cross sectional view showing a configuration of a semiconductor device according to an application example 1 of an embodiment 2.
Figure 17:
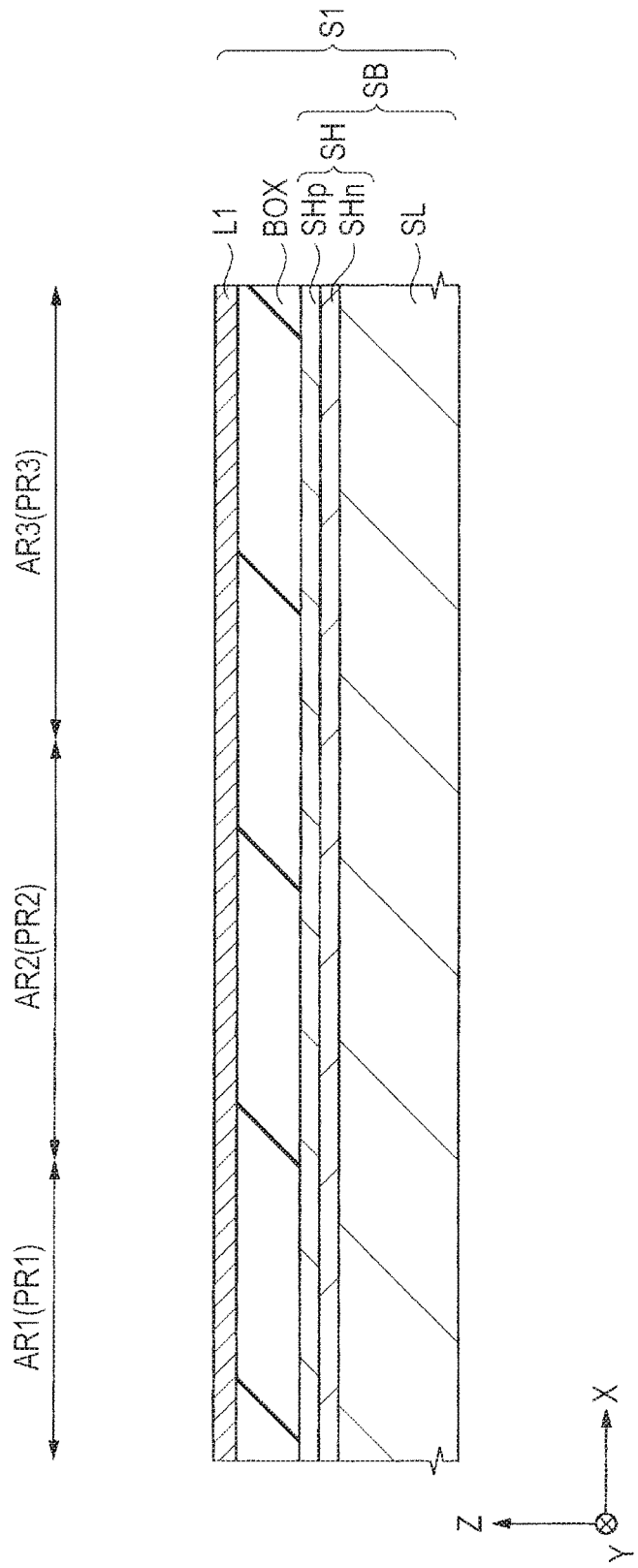
FIG. 17 is a cross sectional view showing a configuration of a semiconductor device according to the application example 1 of the embodiment 2.
Figure 18:
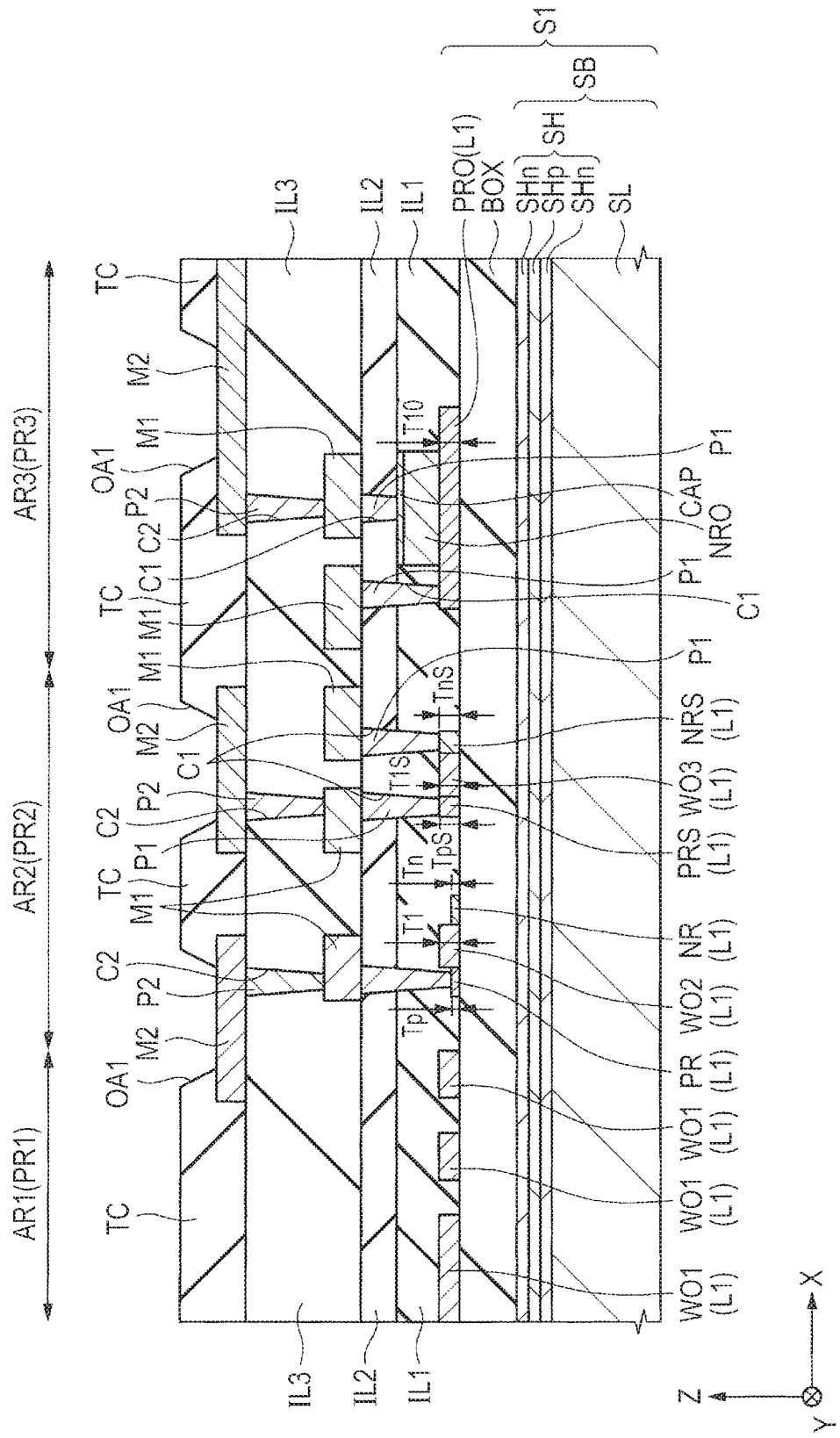
FIG. 18 is a cross sectional view showing a configuration of a semiconductor device according to an application example 2 of the embodiment 2.

FIG. 16 and FIG. 17 are cross sectional views each showing a configuration of the semiconductor device of the application example 1 of this embodiment. FIG. 18 and FIG. 19 are cross sectional views each showing a configuration of the semiconductor device of the application example 2 of this embodiment. FIG. 17 and FIG. 19 illustrate an SOI substrate unit for forming the semiconductor device.

Application Example 1

A substrate (also called a supporting substrate, a semiconductor layer, or a semiconductor substrate) SB of the semiconductor device illustrated in FIG. 16 and FIG. 17 has a low resistance semiconductor layer SL and a high resistance semiconductor layer SH thereover. The high resistance semiconductor layer SH is a semiconductor layer having a resistance higher than that of the low resistance semiconductor layer SL.

The high resistance semiconductor layer SH is formed of an n-type semiconductor layer SHn and a p-type semiconductor layer SHp formed thereover. The high resistance semiconductor layer SH has a thickness of, for example, approximately 5 µm. Each of the n-type semiconductor layer SHn and the p-type semiconductor layer SHp has a thickness of, for example, approximately 1 to 3 µm.

The low resistance semiconductor layer SL is, for example, a silicon (Si) substrate containing impurities. Specifically, it is a p-type Si single crystal substrate which has the surface orientation of (100) and the resistivity of 10 Ωcm. The p-type impurity concentration is, for example, approximately $1 \times 10^{15}/cm^3$.

In the high resistance semiconductor layer SH, for example, a lower n-type semiconductor layer SHn is a surface part of the Si substrate containing impurities, and is a layer containing counter impurities. The n-type semiconductor layer SHn is a layer into which n-type impurities (for example P, As) as counter impurities are ion-implanted, and is an "n-turned" layer in which p-type impurities in the Si substrate are compensated by the implanted n-type impurities, in the surface part of the Si substrate containing the p-type impurities (for example, B). At this time, the implanted n-type impurities preferably have a concentration lower than the impurity concentration of the Si substrate containing p-type impurities (for example, B).

In the high resistance semiconductor layer SH, for example, an upper p-type semiconductor layer SHp is a surface part of the Si substrate containing impurities, and is a layer containing counter impurities. The p-type semiconductor layer SHp is a layer in which n-type impurities (for example, P, As) as counter impurities are ion-implanted and the p-type impurities have a decreased concentration, in the surface part of the Si substrate containing p-type impurities (for example, B). In other words, though the p-type impurities in the Si substrate are compensated by the implanted n-type impurities, the layer is not turned to "n".

The two layers of "np" (SHn, SHp) can be optimized, by adjusting the ion implantation condition (implantation depth or concentration) of the n-type impurities to be implanted to the p-type Si substrate.

The n-type semiconductor layer SHn and the p-type semiconductor layer SHp may be served as an epitaxial growth layer. For example, it is possible to use a semiconductor layer (for example, silicon) as an n-type semiconductor layer SHn which is epitaxial grown while doping the n-type impurities. It is possible to use a semiconductor layer (for example, silicon) as a p-type semiconductor layer SHp which is epitaxial grown while doping the p-type impurities. At this time, the concentration of the doped impurities is preferably lower than the impurity concentration of the Si substrate containing the p-type impurities (for example, B).

In this manner, the high resistance semiconductor layer SH is configured with the n-type semiconductor layer SHn and the p-type semiconductor layer SHp formed thereover. As a result, a depletion layer spreads around the pn junction unit, and the resistance of the high resistance semiconductor layer SH can further be increased. In addition, the impurity concentration (net doping concentration) of the n-type semiconductor layer SHn and the p-type semiconductor layer SHp is made lower than the impurity concentration (net doping concentration) of the low resistance semiconductor layer SL (in this case, a silicon substrate (Si) containing impurities). As a result, it is possible to attain the high resistance due to a decrease in the impurity concentration and the high resistance due to the depletion layer.

The configurations other than the high resistance semiconductor layer SH are the same as those of the embodiment 1 (FIG. 1), and thus will not specifically be described over and over.

Application Example 2

In the application example 1, the high resistance semiconductor layer SH has been configured with two layers of the n-type semiconductor layer SHn and the p-type semiconductor layer SHp formed thereover. However, the high resistance semiconductor layer SH may be configured with three layers of the n-type semiconductor layer SHn, the p-type semiconductor layer SHp formed thereover, and the n-type semiconductor layer SHn formed thereover. The high resistance semiconductor layer SH has a thickness of, for example, approximately 5 μm. Each of the n-type semiconductor layer SHn, the p-type semiconductor layer SHp, and the n-type semiconductor layer SHn has a thickness of, for example, approximately 1 to 2 μm.

The substrate (also called a supporting substrate, a semiconductor layer, or a semiconductor substrate) illustrated in FIG. 18 and FIG. 10 has a low resistance semiconductor layer SL and a high resistance semiconductor layer SH formed thereover. The high resistance semiconductor layer SH has a resistance higher than that of the low resistance semiconductor layer SL.

The high resistance semiconductor layer SH is configured with an n-type semiconductor layer SHn, a p-type semiconductor layer SHp formed thereover, and an n-type semiconductor layer SHn formed thereover.

The low resistance semiconductor layer SL is, for example, a silicon (Si) substrate containing impurities. Specifically, it is a p-type Si single crystal substrate which has the surface orientation of (100) and the resistivity of 10 Ωcm. The p-type impurity concentration is, for example, $1 \times 10^{15}/cm^3$.

In the high resistance semiconductor layer SH, for example, the uppermost n-type semiconductor layer SHn is a surface part of the Si substrate containing impurities, and is a layer containing counter impurities. The n-type semiconductor layer SHn is a layer into which n-type impurities (for example, P, As) as counter impurities are ion-implanted, and is an "n-turned" layer in which p-type impurities in the Si substrate are compensated by the implanted n-type impurities, in the surface part of the Si substrate containing the p-type impurities (for example, B). At this time, the implanted n-type impurities preferably have a concentration lower than the impurity concentration of the Si substrate containing p-type impurities (for example, B).

The p-type semiconductor layer SHp as the intermediate layer is, for example, the surface part of the Si substrate containing impurities, and is a layer containing counter impurities. The p-type semiconductor layer SHp is a layer in which n-type impurities (for example, P, As) as counter impurities are ion-implanted, and is a layer in which the p-type impurities have a decreased concentration, in the surface part of the Si substrate containing p-type impurities (for example, B). In other words, though the p-type impurities in the Si substrate are compensated by the implanted n-type impurities, the layer is not turned to "n".

The lowermost n-type semiconductor layer SHn is, for example, the surface part of the Si substrate containing impurities, and is a layer containing counter impurities. The n-type semiconductor layer SHn is a layer in which n-type impurities (for example, P, As) as counter impurities are ion-implanted, and is an "n-turned" layer in which p-type impurities in the Si substrate are compensated by the implanted n-type impurities, in the surface part of the Si substrate containing the p-type impurities (for example, B). At this time, the implanted n-type impurities preferably have a concentration lower than the impurity concentration of the Si substrate containing the p-type impurities (for example, B).

In this manner, the three layers of "npn" (SHn, SHp, SHn) can be optimized by adjusting the ion implantation condition (implantation depth or concentration) of the n-type impurities to be implanted to the p-type Si substrate.

Accordingly, the high resistance semiconductor layer SH is configured with the n-type semiconductor layer SHn, the p-type semiconductor layer SHp formed thereover, and the n-type semiconductor layer SHn formed thereover, thereby forming the pn junction units in two positions. As a result, a depletion layer spreads from these pn junction units, and the resistance of the high resistance semiconductor layer SH can further be increased. In addition, the impurity concentration (net doping concentration) of the n-type semiconductor layer SHn and the p-type semiconductor layer SHp is made lower than the impurity concentration (net doping concentration) of the low resistance semiconductor layer SL (in this case, a silicon substrate (Si) containing impurities). As a result, it is possible to attain the high resistance due to a decrease in the impurity concentration and the high resistance due to the depletion layer.

The configurations other than high resistance semiconductor layer SH are the same as those of the embodiment 1 (FIG. 1), and thus will not specifically be described over and over.

(Manufacturing Method of SOI Substrate)

Descriptions will now be made to a formation method of an SOI substrate S1 illustrated in FIG. 17 or FIG. 19. Though no particular restriction is made to the formation method of the SOI substrate S1 illustrated in FIG. 17 or FIG. 19, the following formation is possible, for example.

FIGS. 20A-20C to FIGS. 23A-23B are cross sectional views each showing an example of a manufacturing method of the SOI substrate of this embodiment.

Formation Example A

Figure 20A:
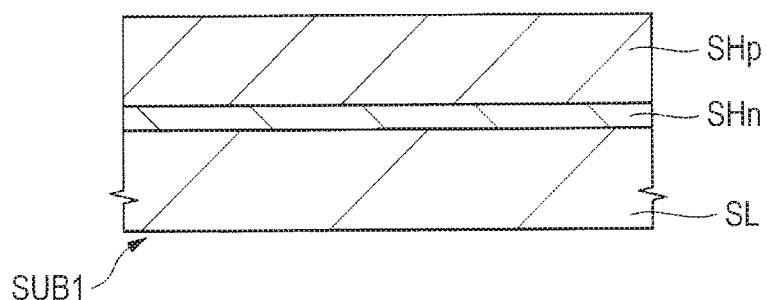
FIGS. 20A-20C are cross sectional views each showing an example of a manufacturing method of an SOI substrate of the embodiment 2.
Figure 20B:
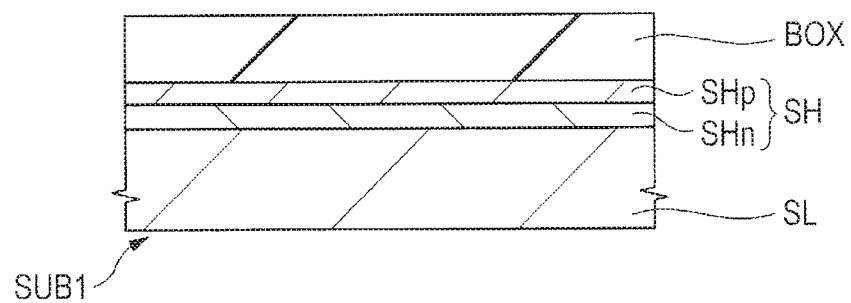
Figure 20C:
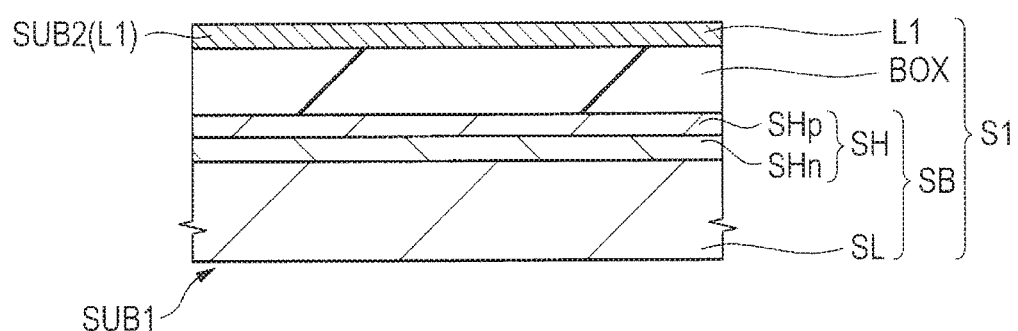

FIGS. 20A-20C are cross sectional views each showing the manufacturing method of the SOI substrate illustrated in FIG. 17. As illustrated in FIG. 20A, an n-type semiconductor layer SHn and a p-type semiconductor layer SHp are formed in the surface part of a p-type first silicon substrate SUB1. As a formation method of these layers, it is possible to use the ion implantation method described in the application example 1 of the embodiment 1. In addition, they may be formed using the epitaxial method described in the application example 2 of the embodiment 1.

As illustrated in FIG. 20B, the surface of the n-type semiconductor layer SHn included in the high resistance semiconductor layer SH of the p-type first silicon substrate SUB1 oxidizes, to form the insulating layer BOX formed of the silicon oxide film. The insulating layer BOX has a thickness of, for example, approximately 2 to 3 µm.

As illustrated in FIG. 20C, a second silicon substrate SUB2 is press-bonded to the surface side of the first silicon substrate SUB1 via the insulating layer BOX at a high temperature. After this, the second silicon substrate SUB2 is used as the upper surface, and it is made thin. In this case, the thin film of the second silicon substrate SUB2 remains over the insulating layer BOX. This thin film serves as the semiconductor layer L1. The thickness of the thin film (L1) of this second silicon substrate SUB2 is, for example, approximately 300 nm.

In this manner, it is possible to form the SOI substrate S1 (FIG. 17) which is formed of the semiconductor layer L1, the insulating layer BOX, and the laminated unit of the high resistance semiconductor layer SH (n-type semiconductor layer SHn, p-type semiconductor layer SHp) and the low resistance semiconductor layer SL for forming the substrate SB.

Formation Example B

Figure 21A:
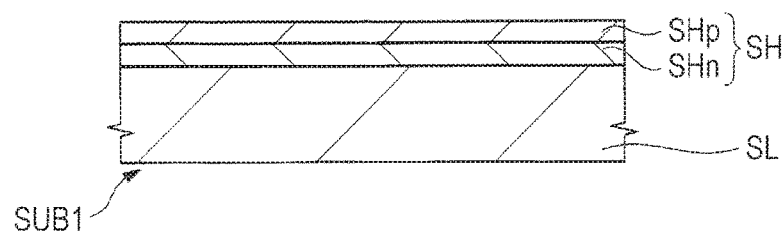
FIGS. 21A and 21B are cross sectional views each showing an example of the manufacturing method of the SOI substrate of the embodiment 2.
Figure 21B:
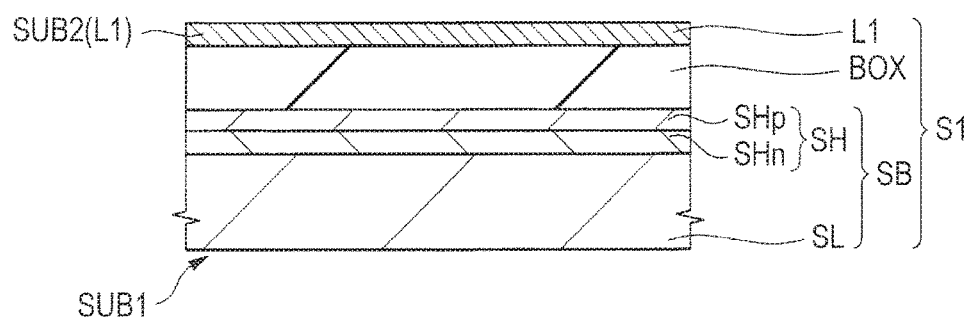

FIGS. 21A-21B are cross sectional views each showing a manufacturing method of the SOI substrate illustrated in FIG. 17. As illustrated in FIG. 21A, an n-type semiconductor layer SHn and a p-type semiconductor layer SHp are formed in the surface part of a p-type first silicon substrate SUB1. As a formation method of these layers, it is possible to use the ion implantation method described in the application example 1 of the embodiment 1. In addition, they may be formed using the epitaxial method described in the application example 2 of the embodiment 1.

A second silicon substrate SUB2 is prepared, and its surface oxidizes, to form an insulating layer BOX formed of a silicon oxide film. The insulating layer BOX has a thickness of, for example, approximately 2 to 3 µm.

As illustrated in FIG. 21B, a high resistance semiconductor layer SH on the surface side of the first silicon substrate SUB1 is press-bonded, at a high temperature, to the insulating layer BOX on the surface side of the second silicon substrate SUB2. After this, the second silicon substrate SUB2 is used as the upper surface, and it is made thin using the CMP method. In this case, the thin film of the second silicon substrate SUB2 remains over the insulating layer BOX. This thin film serves as the semiconductor layer L1. The thin film (L1) of the second silicon substrate SUB2 has a thickness of approximately, for example, 300 nm.

In this manner, it is possible to form the SOI substrate S1 (FIG. 17) which is formed of the semiconductor layer L1, the insulating layer BOX, and a laminated unit of the high resistance semiconductor layer SH (n-type semiconductor layer SHn, p-type semiconductor layer SHp) and the low resistance semiconductor layer SL for forming the substrate SB.

Formation Example C

Figure 22A:
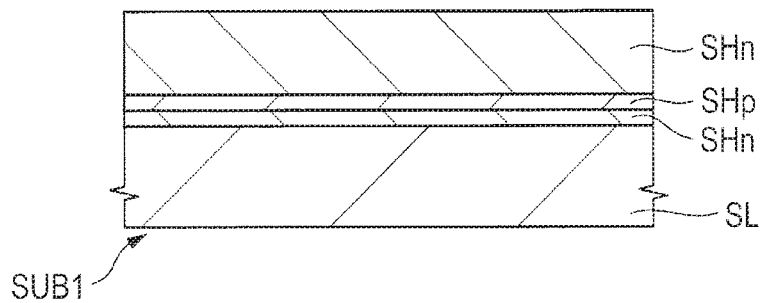
FIGS. 22A-22C are cross sectional views each showing an example of the manufacturing method of the SOI substrate of the embodiment 2.
Figure 22B:
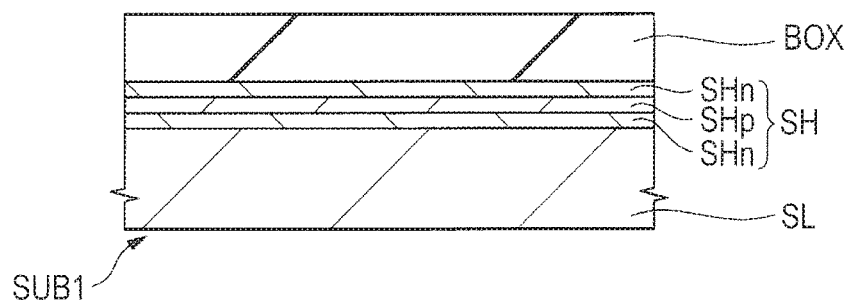
Figure 22C:
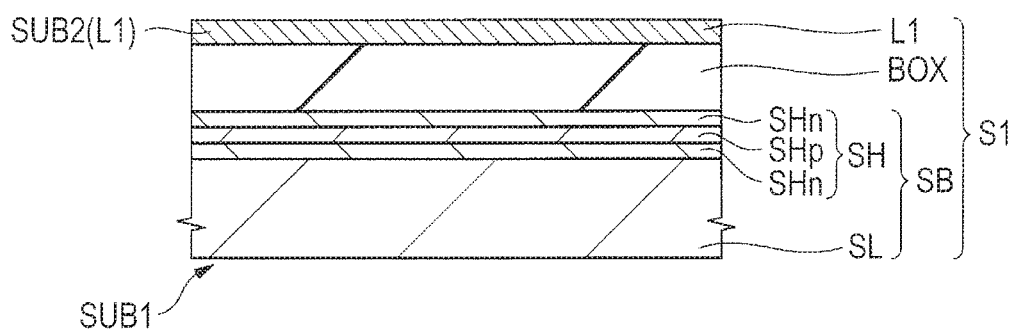

FIGS. 22A-22C are cross sectional views each showing a manufacturing method of the SOI substrate illustrated in FIG. 19. As illustrated in FIG. 22A, the n-type semiconductor layer SHn, the p-type semiconductor layer SHp formed thereover, and the n-type semiconductor layer SHn formed thereover are formed in the surface part of the p-type first silicon substrate SUB1. As a formation method of these layers, it is possible to use the ion implantation method described in the application example 1 of the embodiment 1. In addition, they may be formed using the epitaxial method described in the application example 2 of the embodiment 1.

As illustrated in FIG. 22B, the surface of the n-type semiconductor layer SHn in the high resistance semiconductor layer SH of the p-type first silicon substrate SUB1 oxidizes, to form an insulating layer BOX formed of a silicon oxide film is formed. The insulating layer BOX has a thickness of, for example, approximately 2 to 3 µm.

As illustrated in FIG. 22C, a second silicon substrate SUB2 is press-bonded, at a high temperature, to the surface side of the first silicon substrate SUB1, via the insulating layer BOX. After this, the second silicon substrate SUB2 is used as the upper surface, and it is made thin. In this case, the thin film of the second silicon substrate SUB2 remains over the insulating layer BOX. This thin film serves as the semiconductor layer L1. The thin film (L1) of the second silicon substrate SUB2 has a thickness of approximately, for example, 300 nm.

In this manner, it is possible to form the SOI substrate S1 (FIG. 19) which is formed of the semiconductor layer L1, the insulating layer BOX, and a laminated unit of the high resistance semiconductor layer SH (upper n-type semiconductor layer SHn, p-type semiconductor layer SHp, lower n-type semiconductor layer SHn) and the low resistance semiconductor layer SL for forming the substrate SB.

Formation Example D

Figure 23A:
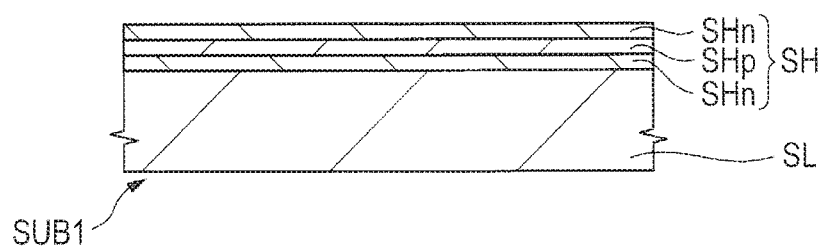
FIGS. 23A and 23B are cross sectional views each showing an example of the manufacturing method of the SOI substrate of the embodiment 2.
Figure 23B:
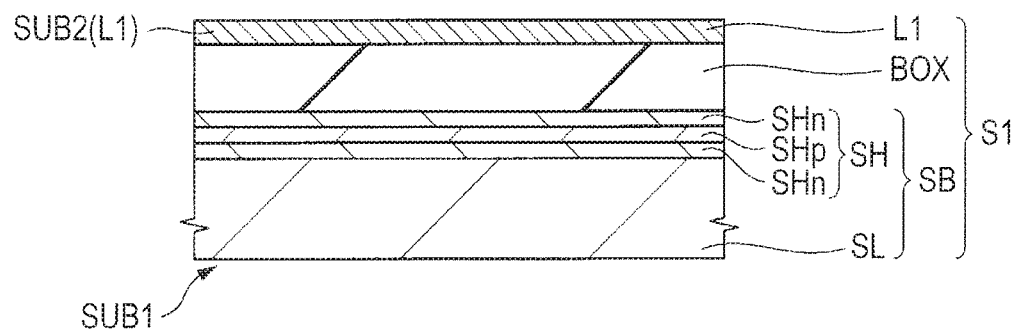

FIGS. 23A-23B are cross sectional views each showing a manufacturing method of the SOI substrate illustrated in FIG. 19. As illustrated in FIG. 23A, an n-type semiconductor layer SHn, a p-type semiconductor layer SHp formed thereover, and an n-type semiconductor layer SHn formed thereover are formed in the surface part of a p-type first silicon substrate SUB1. As a formation method of these layers, it is possible to use the ion implantation method described in the application example 1 of the embodiment 1. In addition, they may be formed using the epitaxial method described in the application example 2 of the embodiment 1.

A second silicon substrate SUB2 is prepared, and its surface oxidizes, to form and an insulating layer BOX formed of a silicon oxide film. The insulating layer BOX has a thickness of, for example, approximately 2 to 3 µm.

As illustrated in FIG. 23B, a high resistance semiconductor layer SH on the surface side of the first silicon substrate SUB1 is press-bonded, at a high temperature, to the insulating layer BOX on the surface side of the second silicon substrate SUB2. After this, the second silicon substrate SUB2 is used as the upper surface, and it is made thin using the CMP method. In this case, the thin film of the second silicon substrate SUB2 remains over the insulating layer BOX. This thin film serves as the semiconductor layer L1. The thin film (L1) of the second silicon substrate SUB2 has a thickness of approximately, for example, 300 nm.

In this manner, it is possible to form the SOI substrate S1 (FIG. 19) which is formed of the semiconductor layer L1, the insulating layer BOX, and a laminated unit of the high resistance semiconductor layer SH (upper n-type semiconductor layer SHn, p-type semiconductor layer SHp, lower n-type semiconductor layer SHn) and the low resistance semiconductor layer SL for forming the substrate SB.

Embodiment 3

In this embodiment, various modifications will now be described.
(Modification 1)
In the embodiment (FIG. 1), as the substrate SB for forming the SOI substrate S1, the silicon (Si) substrate containing the p-type impurities is used. However, it is possible to use the silicon (Si) substrate containing n-type impurities. This substrate containing the n-type impurities is more reasonable than so-called the "high resistance substrate".

Figure 24:
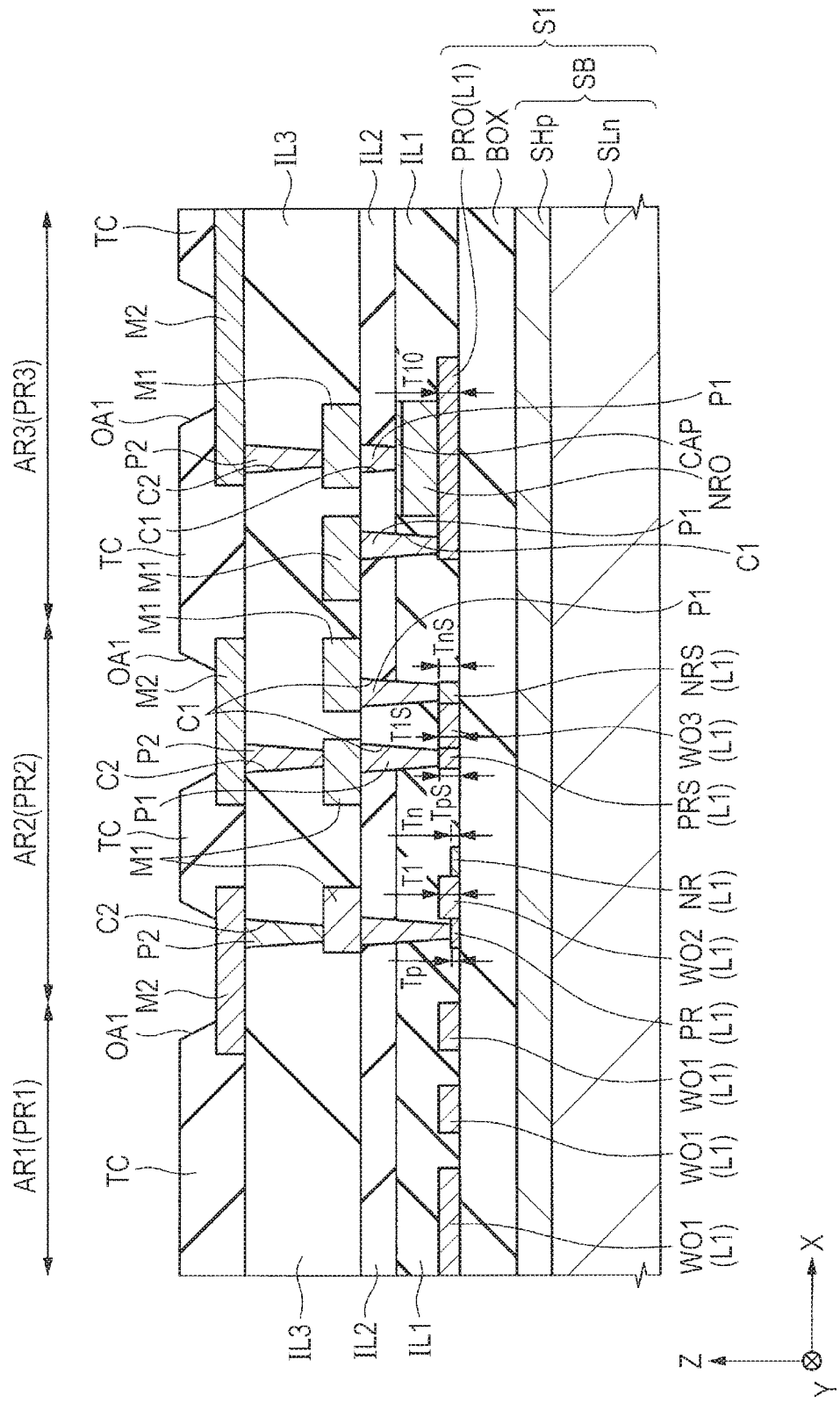
FIG. 24 is a cross sectional view showing a configuration of a semiconductor device according to a modification 1 of an embodiment 3.

FIG. 24 is a cross sectional view showing a semiconductor device of the modification 1 of this embodiment. As illustrated in FIG. 24, the silicon (Si) substrate containing the n-type impurities is used as the low resistance semiconductor layer SLn of the substrate SB, while a layer containing the p-type impurities is used as the high resistance semiconductor layer SHp of the substrate SB. The layer (SHp) containing the p-type impurities may be formed using the ion implantation method, or may be formed using the epitaxial method.

Other than the conductive types of the impurities of the low resistance semiconductor layer SLn and the high resistance semiconductor layer SHp, the configurations are the same as those of the embodiment 1 (FIG. 1).
(Modification 2)
In the embodiment 2, the high resistance semiconductor layer SH is configured with the n-type semiconductor layer SHn and the p-type semiconductor layer SHp formed thereover. That is, the high resistance semiconductor layer SH is configured with the n-type semiconductor layer SHn and the p-type semiconductor layer SHp formed thereover, which are formed entirely over the substrate SB, and the pn junction is formed in a horizontal direction. However, so-called a "Super Junction structure" may be used.

Figure 25:
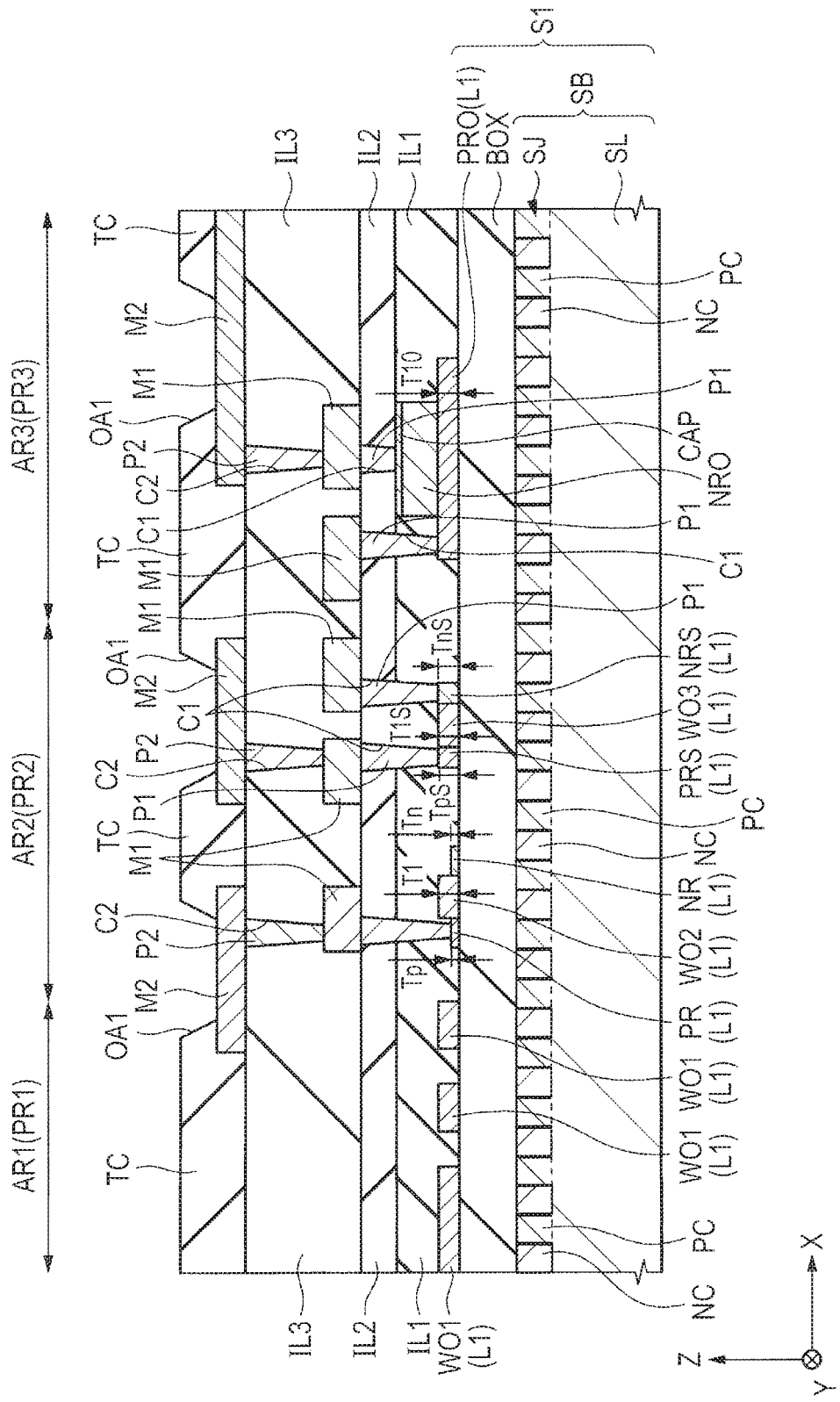
FIG. 25 is a cross sectional view showing a configuration of a semiconductor device according to a modification 2 of the embodiment 3.

FIG. 25 is a cross sectional view showing a configuration of a semiconductor device of a modification 2 of this embodiment. As illustrated in FIG. 25, a plurality of n columns NC are provided at an interval in the silicon (Si) substrate containing the p-type impurities. The n columns NC are n-type semiconductor regions embedded in the trenches. The n columns NC and p columns PC as p-type semiconductor regions between the n columns NC are alternately arranged. The alternate arrangement parts of the n columns NC and the p columns PC serve as super junction units SJ.

In this manner, even when the pn junction is formed in a vertical direction, the depletion layers are connected, resulting in increasing the resistance of the super junction unit SJ as the surface part of the substrate SB.

Other than the super junction unit SJ, the configurations are same as those of the embodiment 1 (FIG. 1).

(Modification 3)
In the embodiment 1, the high resistance semiconductor layer SH has been formed all over the substrate SB. However, the high resistance semiconductor layer SH may be provided partially over the substrate SB.

Figure 26:
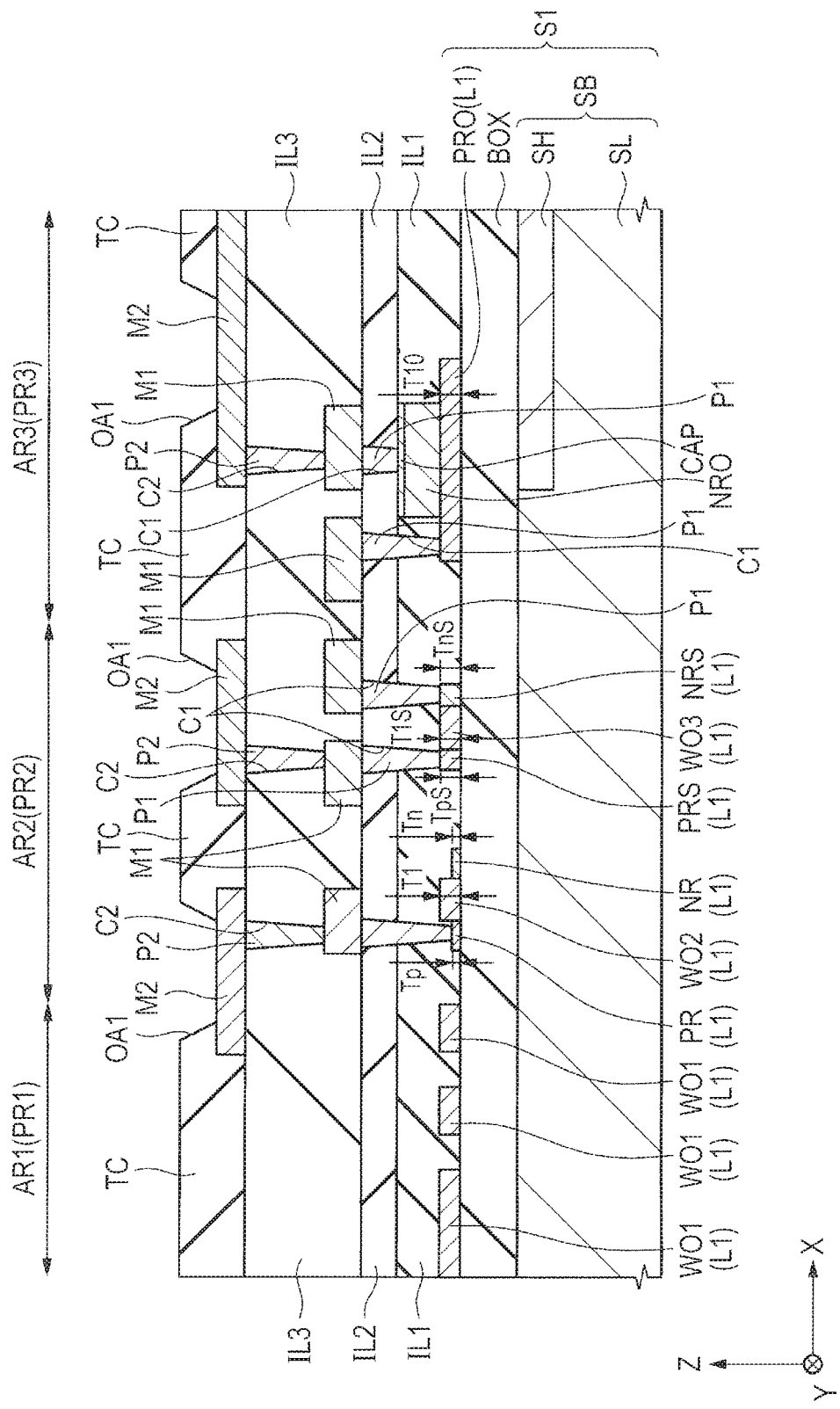
FIG. 26 is diagram illustrating a configuration of a semiconductor device according to a modification 3 of the embodiment 3.
Figure 27:
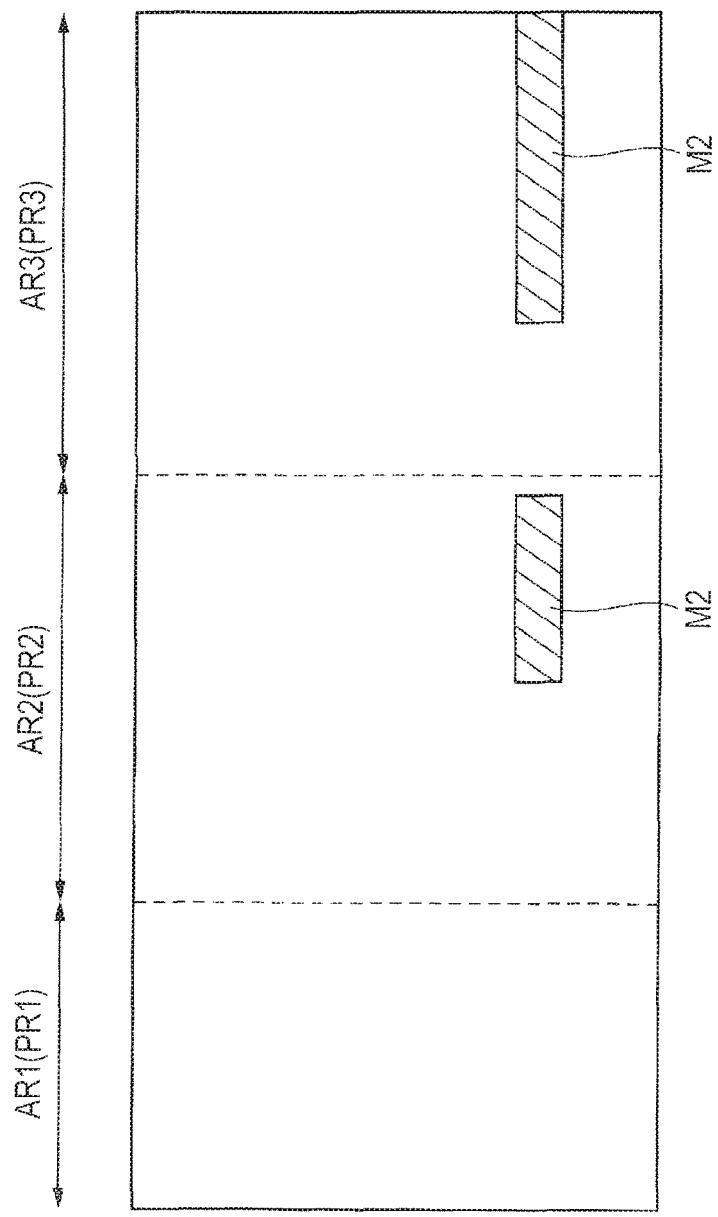
FIG. 27 is a diagram illustrating a configuration of a semiconductor device according to the modification 3 of the embodiment 3.

FIG. 26 and FIG. 27 are diagrams each showing a configuration of a semiconductor device of a modification 3 of this embodiment. FIG. 26 is a cross sectional view, and FIG. 27 is a plan view thereof.

As illustrated in FIG. 26, the silicon (Si) substrate containing the p-type impurities is used as the low resistance semiconductor layer SL of the substrate SB. In a partial region of this substrate, the n-type impurities are implanted, thereby forming the high resistance semiconductor layer SH. In FIG. 26, the high resistance semiconductor layer is provided in a region corresponding to a photoelectric conversion unit PR3. As illustrated in FIG. 27, a transmission line unit PR1 for optical signals, an optical modulation unit PR2, and a photoelectric conversion unit PR3 are provided respectively in areas AR1, AR2, and AR3 of the SOI substrate S1.

In this case, it is possible to reduce the effect of the magnetic field around the wirings M1 and M2 formed in the photoelectric conversion unit PR3, thus restraining the eddy current. As a result, it is possible to improve the transmission characteristic of the electric signal through the wirings.

In FIG. 26, the high resistance semiconductor layer SH has been provided in the region corresponding to the photoelectric conversion unit PR3. However, the high resistance semiconductor layer SH may be provided in the region corresponding to the photoelectric conversion unit PR2. As described in the embodiment 1, the wirings M1 and M2 are provided also in the photoelectric conversion unit PR2. Thus, by providing the high resistance semiconductor layer SH, it is possible to reduce the effect of the magnetic field around the wirings M1 and M2. As a result, the eddy current is restrained, thus enabling to improve the transmission characteristic of the electric signal through the wirings.

Accordingly, the inventions of the present inventors have concretely been described based on the embodiments. However, the present invention is not limited to the embodiments, and, needless to say, various changes may possibly be made.

What is claimed is:

1. A semiconductor device comprising:
    a substrate which has a first semiconductor layer and a second semiconductor layer formed over the first semiconductor layer;
    an insulating layer which is formed over the second semiconductor layer;
    a third semiconductor layer which is formed over the insulating layer;
    an optical waveguide which is formed in the third semiconductor layer; and
    a wiring which is formed over the third semiconductor layer through an insulating film, and
    wherein the second semiconductor layer has a resistance higher than that of the first semiconductor layer.
2. The semiconductor device according to claim 1, wherein a resistance increases from the first semiconductor layer toward the second semiconductor layer.
3. The semiconductor device according to claim 1, wherein the first semiconductor layer and the second semiconductor layer have first conductive type impurities, and
    wherein a concentration of the first conductive type impurities of the second semiconductor layer is lower than a concentration of the first conductive type impurities of the first semiconductor layer.

4. The semiconductor device according to claim 3, wherein the concentration of the first conductive type impurities is decreased from the first semiconductor layer toward the second semiconductor layer.

5. The semiconductor device according to claim 1, wherein the first semiconductor layer has first conductive type impurities;
wherein the second semiconductor layer has second conductive type impurities which are reverse conductive type to the first conductive type, and
wherein a concentration of the second conductive type impurities of the second semiconductor layer is lower than a concentration of the first conductive type impurities of the first semiconductor layer.

6. The semiconductor device according to claim 1, comprising:
a first conductive type first semiconductor unit which is formed in the third semiconductor layer; and
a second conductive type second semiconductor unit which is formed over the first semiconductor unit and reverse conductive type to the first conductive type,
wherein the wiring is electrically coupled to the second semiconductor unit.

7. The semiconductor device according to claim 6, wherein the third semiconductor layer is formed of Si, and wherein the second semiconductor unit is formed of Ge.

8. The semiconductor device according to claim 1, comprising
a third semiconductor unit and a fourth semiconductor unit which are arranged on both sides of the optical waveguide and formed in the third semiconductor layer.

9. A semiconductor device comprising:
a substrate which has a first semiconductor layer and a second semiconductor layer formed over the first semiconductor layer;
an insulating layer which is formed over the second semiconductor layer;
a third semiconductor layer which is formed over the insulating layer;
an optical waveguide which is formed in the third semiconductor layer; and
a wiring which is formed over the third semiconductor layer through an insulating film, and
wherein the second semiconductor layer has a resistance higher than a resistance of the first semiconductor layer,
wherein the first semiconductor layer has first conductive type impurities, and
wherein the second semiconductor layer has a first layer having second conductive type impurities which are reverse conductive type to the first conductive type and a second layer formed over the first layer and having first conductive type impurities.

10. The semiconductor device according to claim 9, wherein a concentration of the first conductive type or second conductive type impurities of the first layer and the second layer is lower than a concentration of the first conductive type impurities of the first semiconductor layer.

11. The semiconductor device according to claim 10, comprising:
a first semiconductor unit which is formed in the third semiconductor layer and which is the first conductive type; and
a second semiconductor unit which is formed over the first semiconductor unit and which is the second conductive type, and
wherein the wiring is electrically coupled to the second semiconductor unit.

12. The semiconductor device according to claim 11, wherein the third semiconductor layer is formed of Si, and wherein the second semiconductor unit is formed of Ge.

13. The semiconductor device according to claim 10, comprising
a third semiconductor unit and a fourth semiconductor unit which are arranged on both sides of the optical waveguide and formed in the third semiconductor layer.

14. A manufacturing method a semiconductor device, comprising:
preparing a semiconductor substrate which has a substrate having a first semiconductor layer and a second semiconductor layer formed over the first semiconductor layer, an insulating layer formed over the substrate, and an element formation layer formed over the insulating layer;
patterning the element formation layer, for forming an optical waveguide; and
forming a wiring above the optical waveguide through an insulating film, and
wherein the second semiconductor layer has a resistance higher than a resistance of the first semiconductor layer.

15. The manufacturing method of the semiconductor device, according to claim 14,
wherein the semiconductor substrate has the second semiconductor layer formed in a surface of a first conductive type first silicon substrate, by ion-implanting second conductive type impurities which are reverse conductive type to the first conductive type.

16. The manufacturing method of the semiconductor device, according to claim 14,
wherein the semiconductor substrate has the second semiconductor layer which is epitaxial grown while doping first conductive type impurities, in a surface of a first conductive type first silicon substrate.

17. The manufacturing method of the semiconductor device, according to claim 14,
wherein the patterning includes patterning the element formation layer, for forming the optical waveguide and a first semiconductor unit coupled to the optical waveguide.

18. The manufacturing method of the semiconductor device, according to claim 14,
wherein the patterning includes patterning the element formation layer, for forming the optical waveguide, a first semiconductor unit coupled to the optical waveguide, and a second semiconductor unit.

19. The manufacturing method of the semiconductor device, according to claim 14,
wherein the patterning includes forming a third semiconductor unit,
wherein the method includes forming a fourth semiconductor unit over the third semiconductor unit, between the patterning and the forming a wiring, and
wherein the wiring is electrically coupled to the third semiconductor unit.

20. The manufacturing method according to claim 19, wherein the third semiconductor unit is formed of first conductive type Si, and wherein the fourth semiconductor unit is formed of second conductive type Ge which is reverse conductive type to the first conductive type.

* * * * *